United States Patent [19]

Ohno et al.

[11] Patent Number: 5,068,529
[45] Date of Patent: Nov. 26, 1991

[54] ABSOLUTE POSITION DETECTION ENCODER

[75] Inventors: Kou Ohno; Tetsuo Hattori, both of Kanagawa; Tsuyoshi Matsumoto, Tokyo, all of Japan

[73] Assignee: Nikon Corporation, Tokyo, Japan

[21] Appl. No.: 453,986

[22] Filed: Dec. 20, 1989

[30] Foreign Application Priority Data

Dec. 22, 1988 [JP] Japan .................................. 63-322189
Dec. 28, 1988 [JP] Japan .................................. 63-328873
Jan. 30, 1989 [JP] Japan .................................. 1-17489

[51] Int. Cl.$^5$ .............................................. G01D 5/34
[52] U.S. Cl. ........................... 250/231.18; 250/237 G
[58] Field of Search ......... 250/231.18, 237 G, 231.16; 356/375; 341/13

[56] References Cited

U.S. PATENT DOCUMENTS 4,688,019 8/1987 Schmitt .......................... 250/231.18
4,945,231 7/1990 Ohya et al. .................... 250/231.18

Primary Examiner—Davis L. Willis
Assistant Examiner—Khaled Shami
Attorney, Agent, or Firm—Michael N. Meller

[57] ABSTRACT

An absolute position detection encoder includes a coder having a track provided with first graduations of an absolute pattern and second graduations of an incremental pattern, plural sensors movable relative to the coder along the longitudinal direction of the track, and a signal processing circuit for processing detection pulse trains, obtained upon reading the first graduations by the sensors, in synchronism with the time point corresponding to approximately the mid position of the minimum reading unit of the first graduation. The encoder outputs the relative position between the coder and the sensors in the form of parallel code signals as the absolute position read out from the absolute pattern graduations on the coder. By detecting the absolute pattern in synchronism with the time point corresponding to substantially the middle of the minimum reading unit of the first graduations, an absolute position detection signal of the correct code contents free of readout errors may be taken out for both the forward and reverse directions of the relative movement. On account of the signal selection function by the binary repetitive rectangular signal obtained from the incremental pattern reading results, the absolute position detection signal of the correct code contents may be taken out simultaneously with turn-on of the power source. The binary repetitive rectangular signal may also be used for generating a sub-scale signal for substantially improving the resolving power.

13 Claims, 32 Drawing Sheets

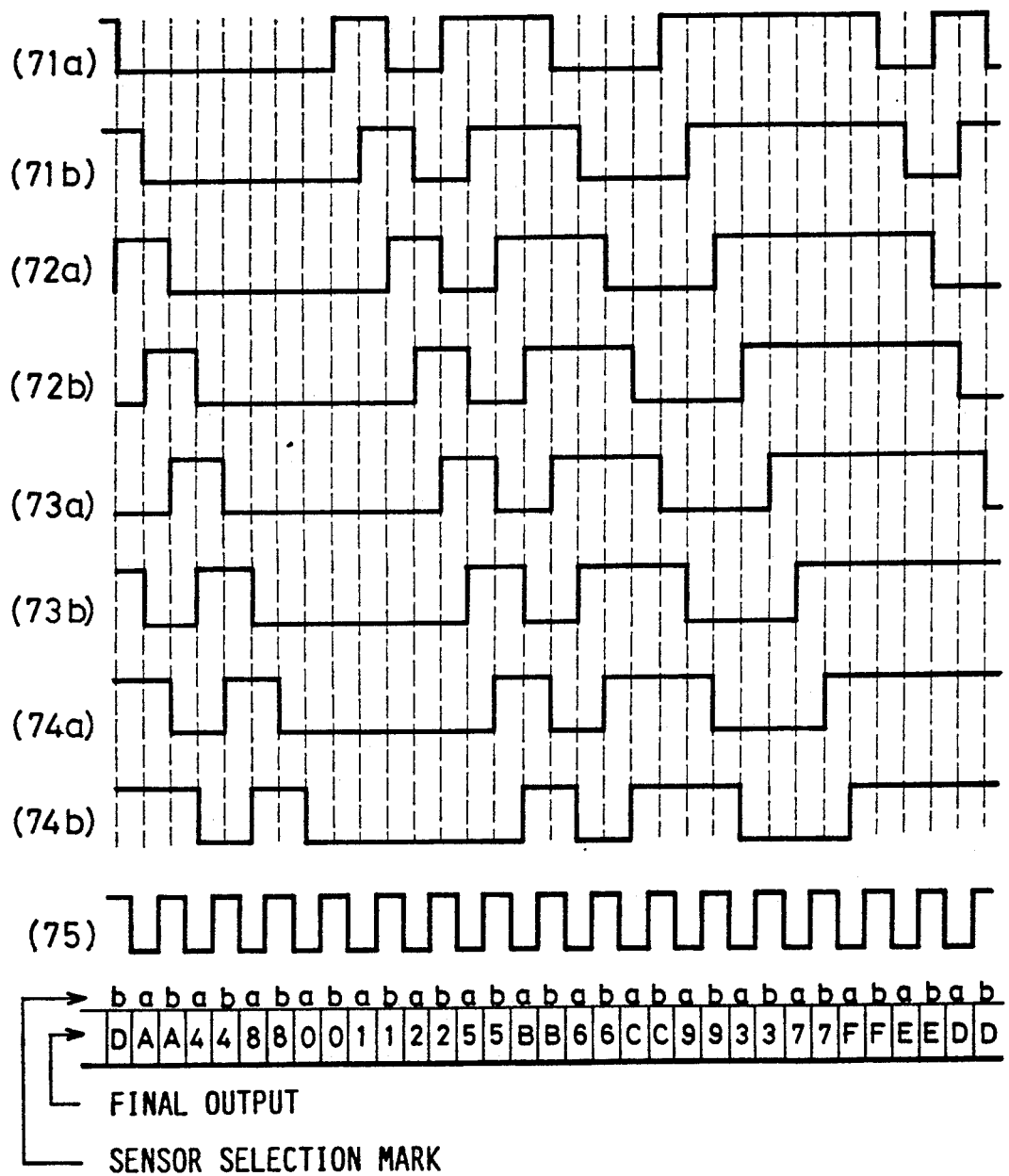

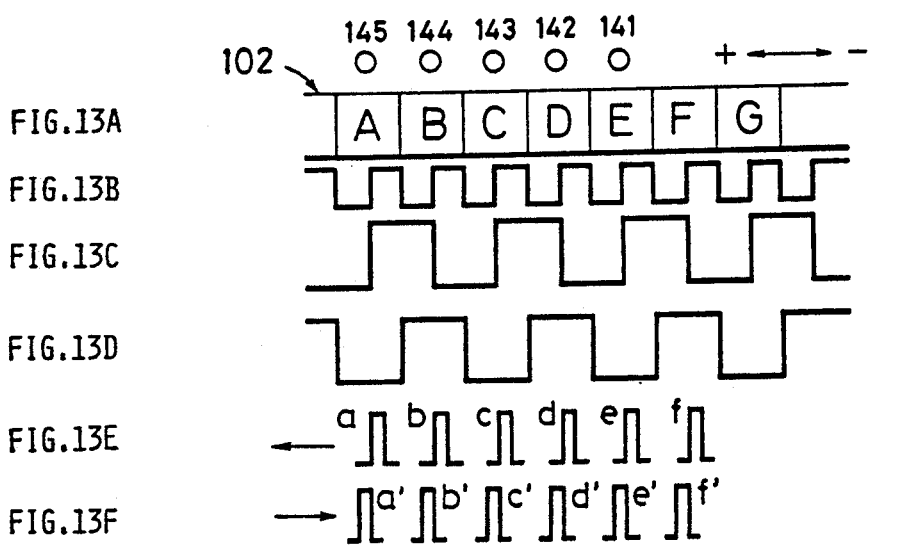

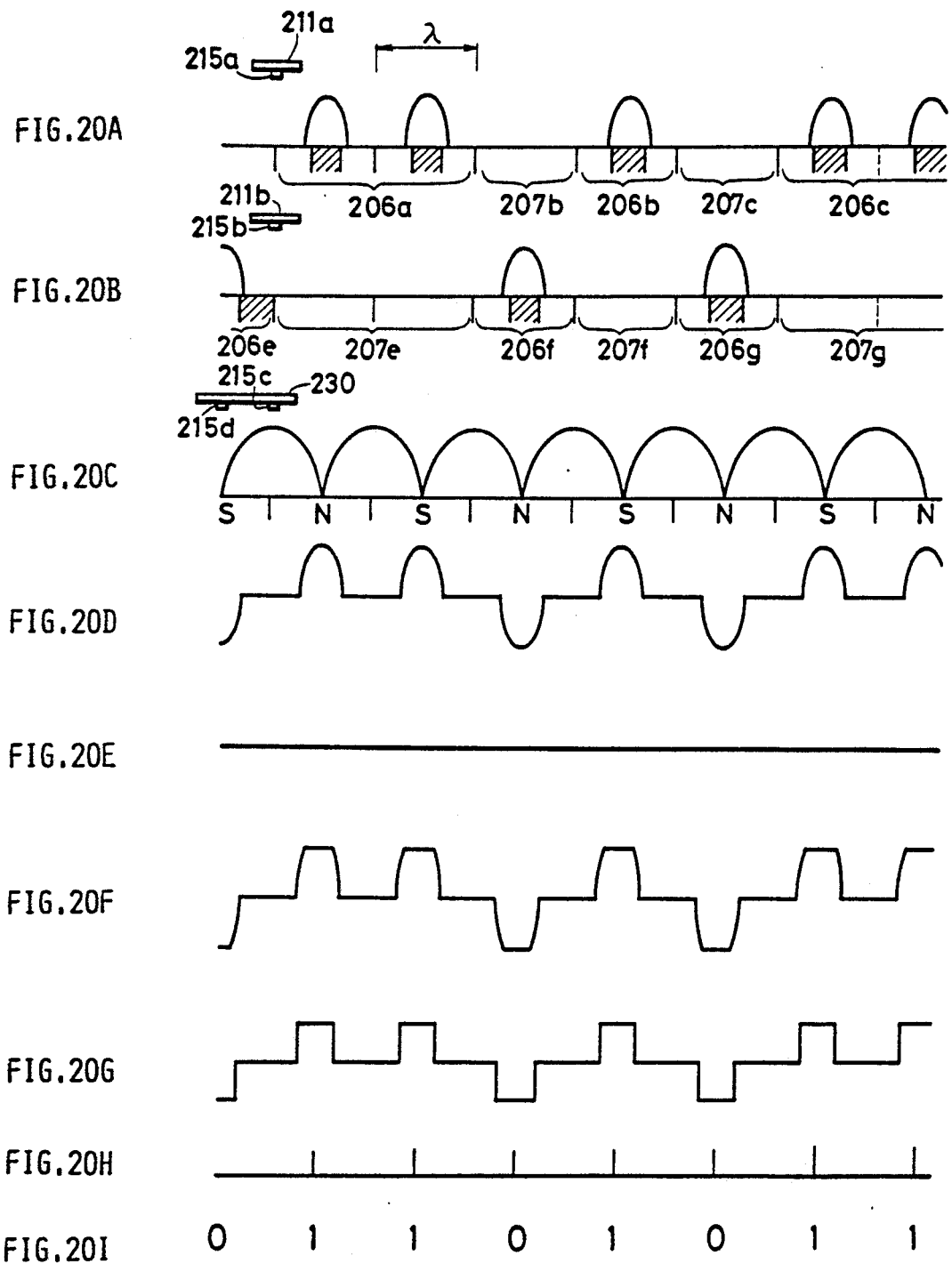

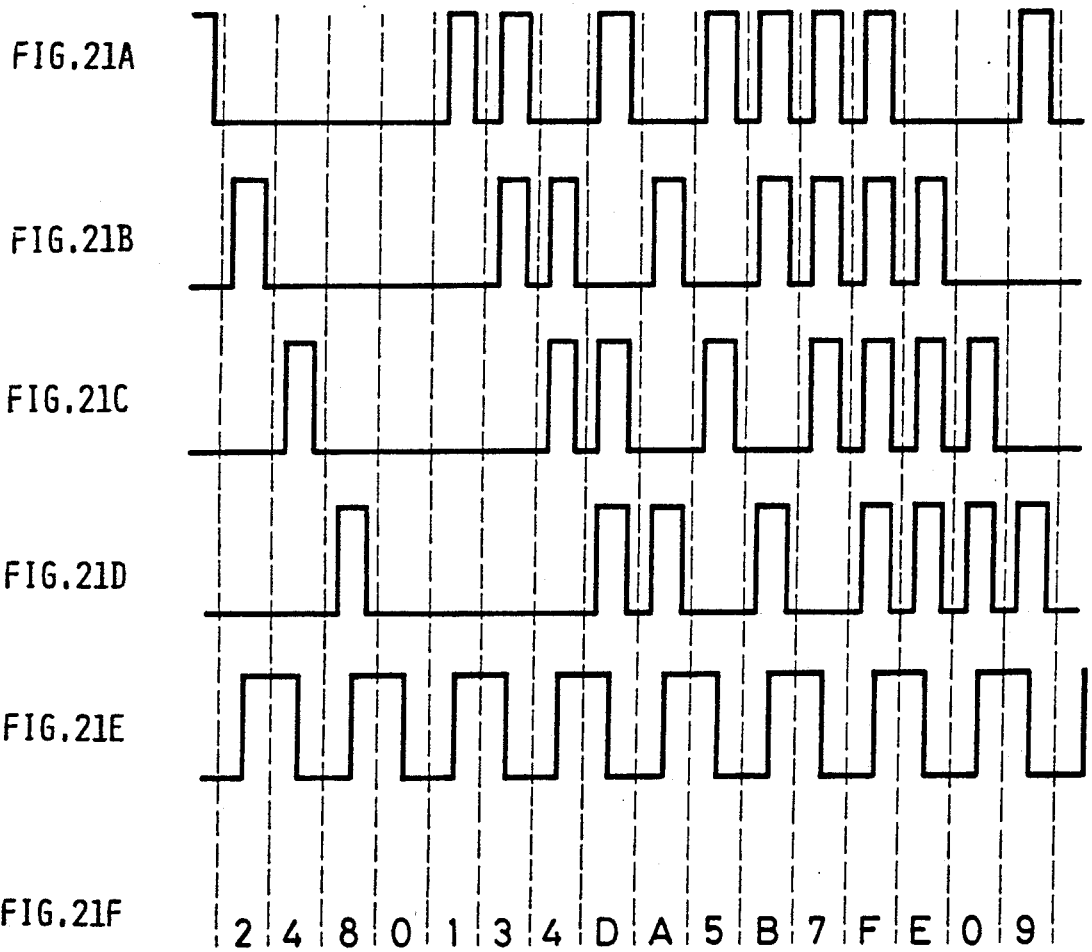

ABSOLUTE POSITION DETECTION ENCODER

BACKGROUND OF THE INVENTION

1. Field of the Invention

The present invention relates generally to encoders and, more particularly, to an absolute position detection encoder usually known as an absolute encoder for reading a relative position between coder and detector by the use of an absolute pattern graduation scale of the coder, the relative position being output in the form of an absolute position.

2. Description of the Prior Art

Linear and rotary type encoders are used extensively as detectors for control over feed rates and stop positions of various actuators. Classified in another way, these encoders fall into two broad types: incremental and absolute. The incremental type encoder detects and outputs increases and decreases in relative movement between coder and detector. The absolute type encoder reads the relative position between coder and detector using a fully periodic array pattern (absolute pattern) scale of the coder. The relative position, after suitable processing, is output as an absolute position.

Conventional absolute encoders include one disclosed in Japanese Patent Pub. Laid-open No. 57-175211 and another in Japanese Utility Model Laid-open No. 60-152916. Encoders of this type work as follows. In an encoder setup, an absolute pattern on a coder is formed as a single track. Along this track are disposed a plurality of detectors at fixed intervals. A binary combination code of readings made magnetically or optically by the detectors relative to the pattern is translated into an absolute position.

Magnetically or optically run, these conventional absolute encoders require placing as many noncontact detectors as the number of bits in the above-mentioned combination code. The output signals from the detectors must be converted into binary numbers after waveform shaping into rectangular waves by an electrical circuit. However, when the output signals from the detectors are converted by waveform shaping into rectangular signals, the signal rise and fall time represents a finite time interval, such that temporal offset in timing is inevitably produced at each detector.

Therefore, when using a finer absolute pattern for raising the resolving power of the coder, timing synchronization with the rise time and the fall time of the output pulses from the detectors can be realized with difficulty, so that, in the course of the forward and reverse relative movements between the detector and the coder, the readout results of the detector outputs at the rise and fall positions may fail to give correct position codes, thereby producing errors in encoder outputs.

On the other hand, the minimum resolving power in the above-mentioned absolute encoder depends on the length in the track direction of the minimum reading unit constituting the absolute pattern. When it is desired to raise the resolving power to the utmost, the quantity of incident light into the detector may be diminished in an optical system encoder because of the reduced slit width of the coder, while the detected magnetic field may be weakened due to the reduced magnetization pitch of the coder in a magnetic type encoder. Thus it was felt that, in either case, limitations are imposed on improving the resolving power within the permissive size range of the coder.

In addition, with this type of absolute encoder, the minimum reading unit of the absolute pattern or the incremental pattern on the coder is formed by magnetized and non-magnetized portions in the case of the magnetic encoder and by transparent and opaque portions in the case of the optical encoder for correspondence with the binary signals. In generals, a signal identifying section, which identifies the signal contents of the minimum reading unit in the pattern to "0" or "1", is of the same length as the overall length in the track direction of the minimum reading unit, so that the boundary area between the portions produces noise to lower the readout accuracy. Therefore, with a magnetic encoder, the magnetized area, which proves to be the signal identification section, must be formed with high dimensional accuracy. With an optical encoder, when the minimum reading unit corresponding to one of the binary signals is formed by a through-hole in the coder, the mechanical strength of the coder is lowered when plural such units are formed so as to be contiguous to one another, so that it becomes necessary to reinforce the coder. Moreover, in both the magnetic and optical encoders, continuous units of a length up to N times the length of the minimum reading unit must be formed in the absolute pattern have the N-bit absolute position signal code contents, so that the larger the number N of the bits of the absolute signal code, the higher is the dimensional accuracy with which the pattern must be formed.

SUMMARY OF THE INVENTION

It is therefore a principal object of the present invention to overcome the above deficiencies and to provide a high precision and high-stability absolute encoder which is free of read-out errors.

According to the present invention, another track having an incremental pattern is formed on a coder parallel to the absolute pattern of a track form, a signal processing means, such as a latch circuit, is actuated using clock signals produced utilizing this incremental track as the strobe signal, and output pulses of the detectors are read simultaneously at the optimum timing to produce an absolute output. Although it is possible with such a system to prevent errors in the encoder output, since the absolute signal is selected using as the strobe signal the clock pulse generated from an incremental signal from another track, the clock pulse being used as the strobe signal is not generated before detection of the rise or fall of the incremental signal, such as at the time of turning-on of power source, so that a correct absolute signal is not outputted and hence it becomes necessary to move the coder a distance corresponding to the minimum reading unit of the absolute signal to bring about the rise or fall of the incremental signal and initial selection by the strobe pulse.

It is therefore a second object of the present invention to provide the above-described absolute encoder in which an accurate absolute position detection output can be produced instantaneously at the time when the power source is turned on.

It is a third object of the present invention to provide the above-described absolute encoder in which the resolving power can be improved an integer number of times by signal processing and in which readout errors are scarcely produced.

It is a fourth object of the present invention to provide the above-described absolute encoder in which little noise is produced at the boundary region between two different minimum reading units making up the pattern and readout accuracy is lowered only slightly.

These objects of the present invention may be realized by the absolute position detection encoder as claimed in the claims.

In one aspect of the present invention, there is provided an absolute position detection encoder comprising coder means having track means in which an absolute pattern having code contents of a plurality of bits is realized by a series type first graduation, detector means relatively movable with respect to said coder means and adapted to read out said first graduation to produce a plurality of detection pulse trains having a phase difference corresponding to a length which is an integer multiple of the minimum readout unit of said first graduation, and signal processing means for processing said detection pulse trains obtained upon reading said first graduation by said detection means with clock signals synchronized at time points corresponding to substantially the intermediate position of the minimum reading unit of said first graduation to produce parallel output signals of signal code contents corresponding to the absolute position of said detection relative to said coder means. In this case, a second graduation may be optionally provided on the track means parallel to the first graduation, this second graduation constituting an incremental pattern composed of binary repetitive graduations of a constant pitch. The detector means read this second graduation simultaneously to produce periodic rectangular signals timed to the unit pulse corresponding to the minimum reading unit in the detected pulse train as the aforementioned relative movement proceeds. The signal processing means are synchronized with these rectangular signals to effect the signal processing.

For accomplishing the above-mentioned second object, the present invention also provides an absolute position detection encoder in which the detector means include a plurality of absolute signal detector sets for reading out said absolute pattern to produce for each of said sets a first signal of a of a corresponding pulse train and a second signal having a phase difference equal to one half the unit pulse width corresponding to the minimum reading unit in said pulse train, and an incremental signal detector for reading out said incremental signal to produce a binary signal having a repetitive period substantially equal to said minimum pulse width at a phase difference about one-fourth (¼) said repetitive period relative to the unit pulse corresponding to said minimum reading unit in said pulse train, and wherein said signal processing means includes signal selection means taking out only said first signal from each absolute signal detector set when said binary signal assumes the one value and taking out only said second signal when said binary signal assumes the other value.

With this type of absolute encoder, when the absolute pattern on the track on the coder is read by a plurality of absolute signal detector sets, first and second signals of pulse trains corresponding to the absolute pattern are output from the respective detector sets. These first and second signals have a phase difference corresponding to one half the pulse width of the minimum reading unit pulse in the pulse trains in each set.

In timed relation thereto, the incremental signal detection generates binary signals of the repetitive period approximately equal to the pulse width of the minimum reading unit with a phase difference equal to about one-fourth the aforementioned repetitive period.

The first and second signals consist of strings of the same contents having a phase difference corresponding to one half the absolute unit pulse width. The binary signal has a repetitive period approximately equal to the absolute unit pulse width and has a phase lead or lag with respect to the first and second signals with a phase difference corresponding to about one fourth the unit pulse width.

Hence, the rise and fall in the pulse train of the first and second signals are synchronized at mid time points of the binary signal pulses. In addition, if the rise and fall in the pulse train of the first signal, for example, are synchronized with the high level of the binary signal, the rise and fall in the pulse train of the second signal are synchronized with the low level of the binary signal. Conversely, when the rise and fall in the pulse train of the first signal are synchronized with the low level of the binary signal, the rise and fall in the pulse train of the second signal are synchronized with the high level of the binary signal.

When the first signal or the second signal of the absolute signal detector of each set is selected and the high or low level is read simultaneously, the absolute position output is produced. In this case, the signal selection means selects the first signal or the second signal as a function of the status of the binary signal, so that when the binary signal assumes a first value or a second value, only said first signal or said second signal is taken out from the absolute signal detector of each set.

In this manner, irrespective of the direction of relative movement between the coder and the detector, the first or the second signal from a number n sets of the absolute signal detectors, each set consisting of two absolute signal detectors, is selected and taken out as a function of the status of the binary signal from the incremental signal selector and converted by signal processing means into parallel data of a predetermined number N (=n) of bits to produce the absolute position signal output.

For example, when the absolute pattern on the coder consists of the 4-bits absolute code, four sets of absolute signal detectors, each set consisting of two absolute signal detectors and one incremental signal detector, are employed.

The four sets of absolute signal detectors are arrayed along the track so that the pitch between the sets is equal to the length of the minimum reading unit of the absolute pattern. That is, in this case, each set consists of two detectors having a distance approximately equal to one half the unit pattern length and four such detector sets are arrayed.

In general, the number n of the absolute signal detector sets satisfies the relation $$2^{n-1} < X \leq 2^n \tag{1}$$

where X stands for the number of graduations of the absolute pattern of the coder, with the total number of the absolute signal detectors being equal to 2n.

When the four detector sets, each consisting of two detectors, are arrayed on the track of the 4-bit absolute pattern, first and second signals consisting of pulse trains having a phase difference corresponding to one half the absolute unit pulse width are sequentially output from the four detector sets as the relative movement proceeds. The four sets of the first signal and the four sets of the second signal are 4-bit parallel data having the same contents but are out of phase with a phase difference corresponding to one half the absolute unit pulse width. During this time interval, the incremental signal detector synchronously generates a binary signal having a repetitive period approximately equal to the absolute unit pulse width, this binary signal having a phase difference about one-fourth the repetitive period with respect to the unit pulse of the first and second signals. In other words, the relative array and position of the incremental pattern on the coder and the incremental signal detector are so selected with respect to the absolute pattern and the absolute signal detector sets that the aforementioned binary signals are produced.

The signal selection means may be constituted by a kind of a selection latching circuit which selects the first signal of each set while inhibiting the second signal when the binary signal is at the high level and which conversely selects the second signal of each set and inhibits the first signal when the binary signal is at the low level. In this manner, the selected signals are taken out from the signal processing means as a 4-bit parallel data output (absolute position signal).

According to the present invention, the signal selection means operates on the basis of the high or low level of the binary signal. The binary signal is preferably produced from the detection signal from a constant pitch incremental pattern provided on the coder. This procedure is equivalent to taking out the so-called phase A and phase B outputs, out of phase by 90 degrees relative to each other, as the detection signals, and performing the selection by the aforementioned signal selection means by these phase A and phase B outputs.

On this aspect of the present invention, correct absolute position signals may be produced on account of the signal selecting function by the above-mentioned binary signal as soon as the power source is turned on. When the absolute pattern on the coder is read by plural detector sets on the track, indefinite areas in the vicinity of the rise and fall of the absolute signal of each set are alternately and complementarily concealed by the incremental signal at the same time, so that an absolute encoder having a high resolving power is provided in which generation of an erroneous output is prevented with an accuracy comparable to that in the case of the incremental encoder.

In another aspect of the present invention, the absolute encoder is also provided with sub-scale generating means for producing, on the basis of the incremental pattern read-out results, a sub-scale pulse signal having a period corresponding to an integer fraction of the period of a unit pulse in the pulse train corresponding to the minimum reading unit in the absolute pattern. In this aspect of the absolute encoder, with the progress in the relative movement between the coder and the detector, clock signals are produced from the incremental signal obtained upon reading the incremental pattern, which clock signals act as sync signals corresponding to the aforementioned relative movement. The high or low level of the pulse train, obtained upon reading the absolute pattern, is discriminated by the clock signals at the time juncture corresponding to the midpoint of the unit pulse width in the pulse train corresponding to the minimum reading unit in the absolute pattern, and an output signal corresponding to the absolute position of the detector relative to the coder is produced by signal processing performed by the signal processing means.

The minimum scale width of the absolute position output signal in this case is determined by the unit pulse width in the pulse train corresponding to the length along the track of the minimum reading unit in the absolute pattern, and determines the resolving power of the encoder.

In this aspect of the invention, in consideration that the incremental signal obtained upon reading the incremental pattern in timed relation with the reading of the absolute pattern includes position data in the unit pulse width, this position data is taken out as sub-scale signal, that is, as a sub-signal corresponding to vernier graduations whereby the minimum reading scale width is subdivided into plural equal portions. That is, the sub-scale signal generating means generates from the incremental signal a pulse output having a period corresponding to an integer fraction of the period of the unit pulse in the pulse train corresponding to the minimum reading unit in the absolute pattern and outputs the pulse as the sub-scale signal. Therefore, with the absolute encoder of the present invention, when the absolute position signal produced from the absolute signal detector represents a 4-bit binary number, the parallel code signal of the ultimate absolute position output is made to represent a 5-bit binary signal, and the reading of the sub-scale signal output is used as the least or most significant bit to improve the resolving power of the absolute position output by an amount corresponding to the number of graduations of the subscale signal.

It is now assumed that a first track having an absolute pattern and a second track having an incremental patter consisting of a repetition of unit graduations corresponding to the minimum reading unit of the absolute pattern (equivalent to ½ pitch) are provided in parallel on a coder, that a phase A output and a phase B output consisting of rectangular signals out of phase by 90 degree relative to each other and having a duty cycle of 50% may be taken out, as the incremental pattern detection signals, from the detector movable along the track length, along with the absolute signals, as the read-out results of the absolute pattern, and that the aforementioned phase B output is synchronized with the absolute signal taken out from the detector. In such a case, if the high or low level of the absolute signal pulse is read, with the rise and the fall of the phase A output as the clock signal, and a circuit for generating a pulse signal corresponding to an exclusive or of the phase A and phase B outputs is provided as the sub-scale signal generating means, this pulse signal has a period equal to one half the period of a unit pulse in the pulse train corresponding to the minimum reading unit in the absolute pattern. Therefore, if this pulse signal is used additionally as the sub-scale signal as the least or most significant bit of the absolute position output signal, a 1-bit sub-scale signal is annexed to the absolute position output from the absolute signal detector, so that the resolving power is doubled.

The number of sub-scale signal bits is not limited to unity. For example, if the incremental signal output is the phase A and phase B outputs out of phase by 90 degree relative to each other, and the length of the unit graduations of the incremental pattern along the track direction is one half the minimum reading unit of the absolute pattern, the number of bits of the sub-scale signal is two and the resolving power is quadrupled. The number of phases of the incremental signals is also not limited to two (A and B) but the incremental signals of any other number of phases, such as three phases (A, B and C) with a phase difference of 120 degree or 60 degrees, or four phases (A, B, C and D) with a phase difference of 90 degrees or 45 degrees may be utilized to correspondingly improve the resolving power.

In general, a pulse output having a period corresponding to a k number fraction of a period of a unit pulse in the pulse train corresponding to the minimum reading unit in the absolute pattern, being an integer, may be produced from the incremental signal, with the use of the sub-scale signal by this pulse signal. In this case, the resolving power may be improved be a fraction of k.

In this aspect of the present invention, when the absolute pattern on the coder is read by plural detectors on the track, the rectangular signals from the detectors are read at substantially the midpoints of the pulse width of the minimum reading unit, and a sub-scale signal is synchronously output which will divide the pulse width corresponding to the minimum reading unit of the read absolute signal train into plural equal portions. Hence not only the outputs of the respective detectors can be read and output without errors, but also the resolving power can be doubled by electrical signal processing in accordance with the division number without using a finer absolute pattern of the coder. In this manner, there may be provided an absolute encoder which will ultimately produce the absolute position output with a high resolving power.

In still another aspect of the present invention, for accomplishing the above-mentioned fourth object, a signal identifying section, serving as an area identifying the binary signal of at least one of two minimum reading units constituting the first graduations, is respectively formed in an area of said reading unit which is shorter than the overall length along the track of the reading unit.

The signal identifying section means an area or region for identifying if the reading unit indicates a signal "0" or a signal "1". Taking an example of a magnetic encoder, a magnetized region exists in a position of a reading unit indicating a signal "1", whereas no magnetized portion exists in the other reading unit indicating a signal "0". This partial magnetized region in the one reading unit represents the signal identifying section which identifies the reading unit as the signal "1". Conversely, in the conventional coder, the totality of the area of the one unit indicating a signal "1" is occupied by the magnetized portion, such that the unit as a whole represents the signal identifying section.

In this aspect of the coder of the present invention, since the signal identifying section exists only in a partial area of the unit, it is necessary to perform reading within the magnetized portion. It is therefore not preferred that the signal identifying sections be at different positions from unit to unit, as long as the same type of the reading unit is concerned, but rather it is preferred that the signal identifying sections exist at approximately the midpositions of the unit areas of all of the reading units.

In this aspect of the coder, since the reading unit is read at the signal identifying section, separate clock signals for taking the read-out timing are required. Although these clock signals may be acquired by a separate timepiece, it is more advisable to provide an incremental pattern on the same or a separate coder and to read out the pattern by a separate detector to produce clock signals. In this case, since the clock signals fluctuate to some extent in synchronization, it is preferred to find the range of the fluctuations by calculation on the basis of the relative speed between the coder and the reading head to find the range of fluctuations in the reading position in each unit along the track in advance and to widen the minimum length extent of the signal identifying section beyond the range of fluctuations so that the range of fluctuations may be included within the minimum length extent of the signal identifying section.

As a principle, the above-mentioned coder is preferably combined with the system of simultaneously reading the output pulses of the detectors reading out the absolute pattern by the signal processing circuit at the optimum timing to produce an absolute output, by actuating the signal processing circuit using the clock signals obtained from the incremental track readout results as the strobe signal. However, the coder itself may be used in a system of producing an absolute output by fetching series data absolute signals from the detectors at an optimum timing into, for example, a shift register, by clock signals, and performing serial/parallel conversion of these absolute signals.

With the absolute encoder, employing the above-described encoder, when the high or low level of the absolute signal pulse from plural detectors movable along the track relative to the coder is read, only the signal identifying section shorter in length than the minimum reading unit is synchronized with a separate clock pulse signal so as to be read within the corresponding pulse width. In the absolute encoder, employing the coder of the present invention, when the absolute pattern of the track on the coder is read at each detector, the pulse trains taken out from the detectors are in the form of serial data corresponding to the digital code array conforming to the constant unit pitch of the absolute pattern. Thus the high or low level of the unit pulse constituting the pulse trains is read in synchronism with separate clock pulse signals for each reading unit. In this manner, the detector outputs may be read at stable time junctures different from the rise and fall of the unit pulses of the pulse trains, on the basis of the clock signals, so that it becomes possible to reduce the number of errors in the encoder output to an extremely small value. In this case, since the signal identifying section identifying that the minimum reading unit in the absolute pattern is "0" or "1" is shorter in length than the length of the reading unit, a definite interval may be provided from the neighboring signal identifying section.

Although the clock pulses are preferably produced from the readout results of the incremental pattern provided on the coder along with the absolute pattern, they may also be produced from an incremental pattern on a separate coder connected by a shaft to the firstly mentioned coder. In such a case, the length of the signal identifying section along the track is determined by taking the shaft torsion into account simultaneously.

In the above aspect of the present invention, since the signal identifying section in the absolute pattern on the coder is shorter than the minimum reading unit, readout may be affected to a lesser extent from the adjacent reading units so that readout accuracy may be improved. On the other hand, formation of the absolute pattern on the coder as well as assembling and adjustment of the encoder may be facilitated. More specifically, since the rectangular signals representing the readout results are read within a pulse width shorter than the minimum reading unit on the basis of separate clock signals, the high or low level of the pulses of the detection signals from the separate detectors may be fetched simultaneously at stable time junctures. Thus there may be provided an absolute encoder of higher resolving power free from the risk of error generation in the output signal.

The above and other features and advantages of the present invention will become clearer from the following description given in conjunction with the accompanying drawings.

BRIEF DESCRIPTION OF THE DRAWINGS

FIG. 3 is a timing chart of the waveform at various parts for illustrating the operation.

FIGS. 4A-4D show several examples of the absolute coder for obtaining absolute signals of different bits.

FIG. 5 shows the absolute code for reading with an interval at a predetermined pitch.

FIG. 6 shows an absolute code for the number of graduations equal to 360.

FIG. 7 shows an absolute code for the number of graduations equal to 1000.

FIG. 8 shows an absolute code for the number of graduations equal to 2000.

FIGS. 10A, 10B and 10C show an absolute code for the number of graduations equal to 10,000.

FIGS. 11A, 11B, 11C, 11D, 11E, 11F, 11G and 11H show an absolute code for the number of graduations equal to 21,600.

FIGS. 13A-13M shows the latching operation of a changeover latch circuit of FIG. 12B during inversion and the state of the sub-scale signal.

FIGS. 20A-20I show waveforms at various portions of the signal processing circuit and the horizontal magnetic field pattern by the magnetized graduations of the incremental pattern and the absolute pattern formed on the coder track.

FIGS. 21A-21F show the ultimate output waveform of the absolute encoder according to the third embodiment.

DESCRIPTION OF THE PREFERRED EMBODIMENTS

First Embodiment

Figure 1:
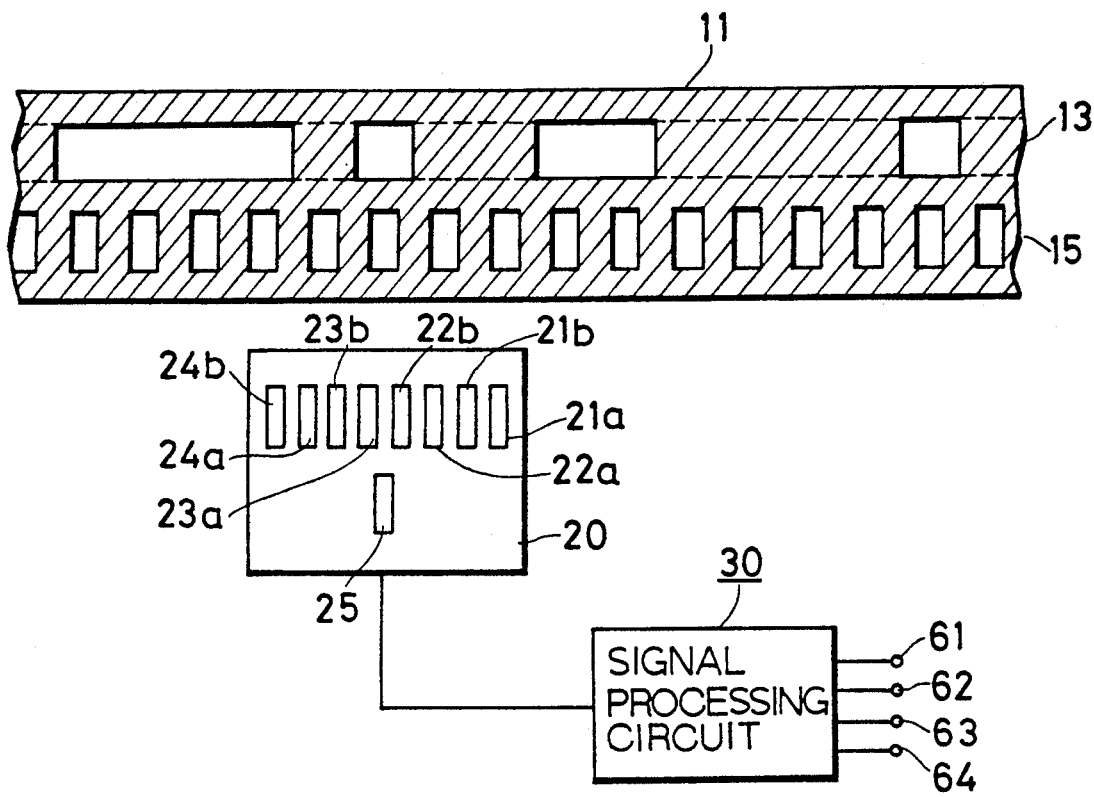
FIG. 1 shows diagrammatically the construction of an optical absolute encoder according to a first embodiment of the present invention.

FIG. 1 shows a first embodiment of the present invention for a 4-bit optical absolute encoder employing a photoelectric converting element in the detection.

In FIG. 1, the absolute encoder is comprised of a coder (scale) 11, a detector 20 for reading the incremental signal and the absolute signal recorded on the coder, and a signal processing circuit 30 for processing signals from the detector and converting them into 4-bit parallel data indicating the absolute position.

The coder (scale) 11 is formed by a transparent base plate, on the surface of which there are provided in parallel a first track 13 provided with an absolute pattern of bits "0" and "1" indicated by opaque portions (hatched portions) and by deposited metal and transparent portions (blank portions) and a second track 15 formed by alternate repetition of 32 equal length portions of opaque and transparent portions to form an incremental pattern.

The absolute pattern formed on the first track 13 is a 4-bit absolute code (N=4) obtained by dividing the overall scale by 16 minimum reading unit patterns to give a number of graduations equal to 16, and has the pattern of (0000101100111101)

This absolute pattern is shown on the first track 13 of FIG. 1, looking sequentially from left towards right in the figure, four consecutive "0" graduations by transparent portions, one "1" graduation by an opaque portion, one "0" graduation by a transparent portion, two consecutive "1" graduations by opaque portions, two consecutive "0" graduations by transparent portions, four consecutive "1" graduations by opaque portions, one "0" graduation by a transparent portion, and one "1" graduation by an opaque portion.

The second track 15 has an incremental pattern for producing the binary signal of signal selection. On this track 15, there are arrayed alternately transparent and opaque 32 divisions, each having a length equal to one half the minimum reading unit graduation of the absolute pattern. This incremental pattern is arrayed with a phase difference corresponding to one-fourth the length of the unit graduation relative to the absolute pattern.

The detector 20 is provided with eight photodiodes 21a, 21b to 24a, 24b, making up a photodiode diode array as the detector for detecting absolute signals, and a sole photodiode 25 as the detector for detecting the incremental signals. The light is irradiated from above on the coder 11 to detect the absolute pattern on the track 13 by the photodiodes 21a, 21b to 24b on the underside of the coder 11. The incremental pattern on the track 15 is detected by the photodiode 25. The transmitted light stands for "0": and the intercepted light stands for "1".

Figure 2:
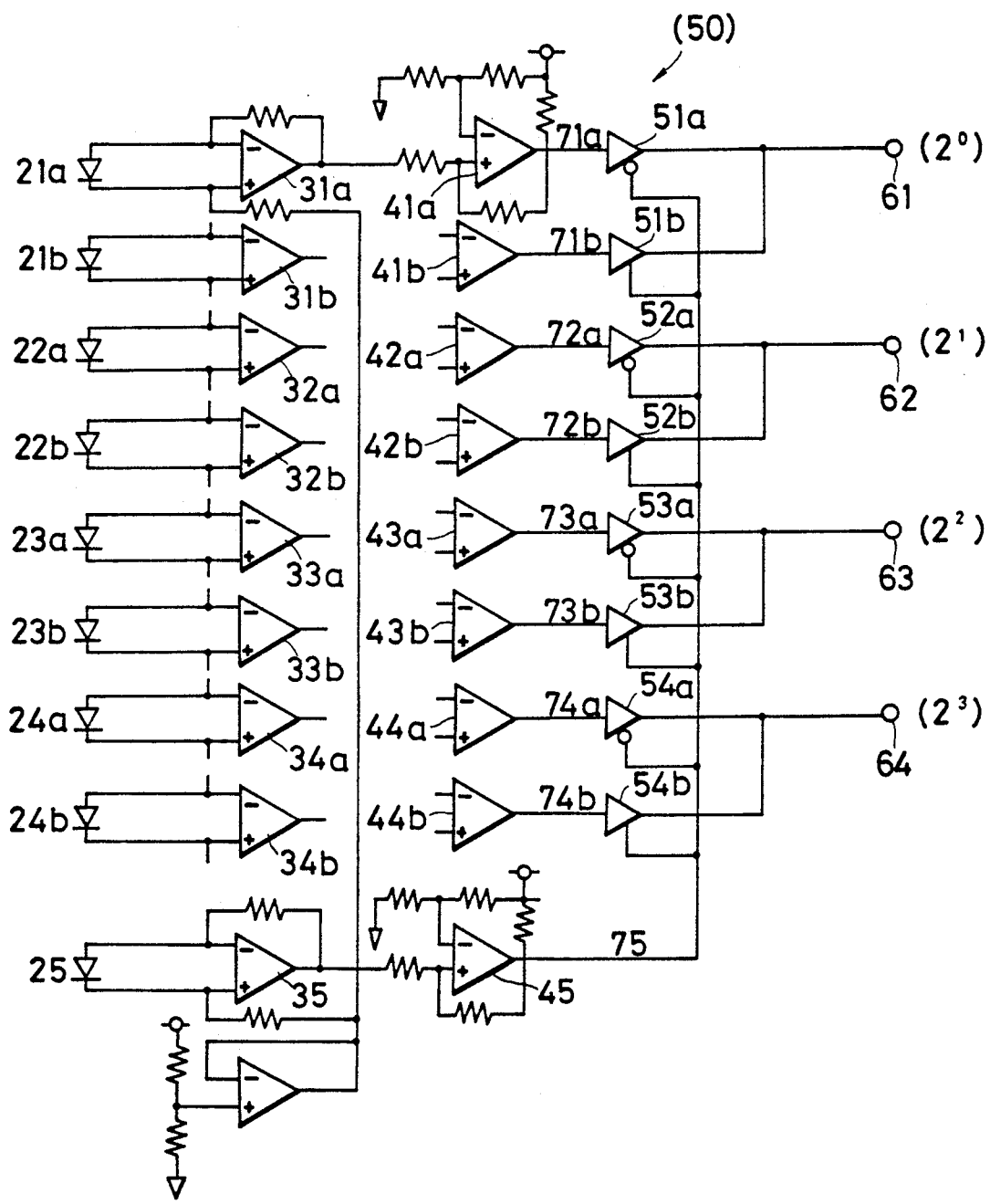
FIG. 2 shows an example of a signal processing circuit for processing the detection output of a detector.

FIG. 2 shows an example of a circuit of the signal processing section 30 for processing the detection output of the photodiodes 21a to 24b and 25.

Thus the detection outputs of the photodiodes 21a, 21b to 24a, 24b, functioning as the absolute signal detections, are amplified by amplifiers 21a, 21b to 34a, 34b and waveform shaped by comparators 41a, 41b to 441, 44b so as to be input to tristate buffer circuits 51a, 51b to 54a, 54b, functioning as a signal selection circuit 50, in the form of pulse trains 71a, 71b to 74a, 74b each formed by rectangular wave signals.

On the other hand, a detection output from the photodiode 25 as the incremental signal detector is similarly waveform shaped by an amplifier 35 and a comparator 45 into a rectangular wave signal being input as a binary signal 75 to control input terminals of the tristate buffer circuits 51a, 51b to 54a, 54b of the signal selection circuit 50.

Thus, when the binary signal 75 from comparator 45 is at the low level, tristate buffer circuits 51a, 52a, 53a, 54a output pulse trains based on the detection signals from the photodiodes 21a, 22a, 23a, 24a to output terminals 61, 62, 63, 64. On the other hand, when the binary signal 75 from comparator 45 is at the high level, the tristate buffer circuits 51b, 52b, 53b, 54b output pulse trains based on detection signals from the photodiodes 21b, 22b, 23b, 24b to the output terminals 61, 62, 63. 64.

FIG. 3 shows the waveform for illustrating the relation between the output waveform of each comparator and the ultimate output signal. In this figure, sensor selection signals a, b mean that, when the binary signal 75 is at the low level, pulse trains, 71a, 72a, 73a, 74a based on the detection outputs of the photodiodes 21a, 22a, 23a, 24a output from comparators 41a, 42a, 43a, 44a are selected as the ultimate outputs, whereas, when the binary signal 75 is at the high level, pulse trains 71b, 72b, 73b, 74b based on the detection outputs of the photodiodes 21b, 22b, 23b, 24b output from the comparators 41b, 42b, 43b, 44b are selected as the ultimate outputs. As for the ultimate output, the parallel signal code of the selected pulse train is represented by the hexadecimal number.

The phase relationship between the absolute signal and the incremental signal is so set that the rise and fall timings of the pulse trains 71a, 72a, 73a, 74a based on the detection outputs of the one set of photodiodes 21a, 22a, 23a, 24a are approximately at the center of the pulse width at the low level time of the binary signal 75, and that the rise and fall timings of the pulse trains 71b, 72b, 73b, 74b based on the detection outputs of the other set of photodiodes 21b, 22b, 23b, 24b are at approximately the center of the pulse width at the high level time of the binary signal 75. In this manner, the selected output signal is free of the indefinite portions in the vicinity of the rising and falling portions of the rectangular wave of the absolute signal pulse train to positively inhibit readout of erroneous contents. Such selection of the phase difference timing may be easily realized by suitably setting the phase difference of the combination of the incremental pattern track 15 and the photodiode 25 adapted for its detection with respect to the combination of the absolute pattern track 13 and the photodiode 25 adapted for its detection with respect to the combination of the absolute pattern track 13 and the photodiode arrays 21a to 24b adapted for its detection.

The absolute pattern is now explained. In the embodiment of FIG. 1, where N=4, the number of graduations is 16 (=$2^N$), as described above. As depicted in FIG. 1a, the absolute pattern on the track 2 is arranged so that when any four contiguous graduations along the circumference of the coded disk 1 are shifted one graduation at a time, the same 0–1 combination code signal is not formed by these four graduations throughout the entire rotation of the coded disk 1. Thus the absolute pattern, as described above, is 0 0 0 0 1 1 0 1 0 1 1 1 1 0 0 1

When output terminal 20a is assigned to a digit $2^0$, 20b to $2^1$, 20c to $2^2$ and 20d to $2^3$, a fourbit absolute signal is obtained as a parallel signal data.

In FIG. 3, a hexadecimal output value keyed to each absolute signal is shown to the right.

In the present embodiment, the indefinite regions in the vicinity of the rise and fall edges of the turn absolute signals are alternately and complementarily combined with the binary incremental signals before being output to realize permanently stable taking out of the absolute position output signals and acquisition of the instant outputting at the time of turning-on of the power source.

Although the numerals in the final output signal are not arrayed in order in FIG. 3, they may be converted into a desired sequence of numbers by suitable conversion means, such as ROMs.

Various absolute pattern arrays may be used other than the division into 16 equal portions. Such an array may be determined in the following manner.

An absolute pattern is arranged as follows. Where the number of bits and that of graduations for an absolute code are sufficiently small, the absolute pattern may be arrived at by trial and error. When these numbers become larger, it may become necessary to use a computer for arranging the pattern.

Where a four-bit absolute code signal is desired, the process of arranging the absolute pattern may proceed as follows. There is necessarily a case in which all four contiguous bits are "0". So the combination of the contiguous four bits "0" always occurs. Should a fifth "0" appear, the same combination would be encountered. So there must be a "1" following the four contiguous "0"s. In this manner, "0" or "1" is added consecutively to a successive four-bit combination that occurs following each single graduation shift, without making up the same combination of bits.

The result of having a computer perform the computations described above is shown in FIGS. 4(a) to 4(d).

Figures 4A, 4B, 4C, 4D:
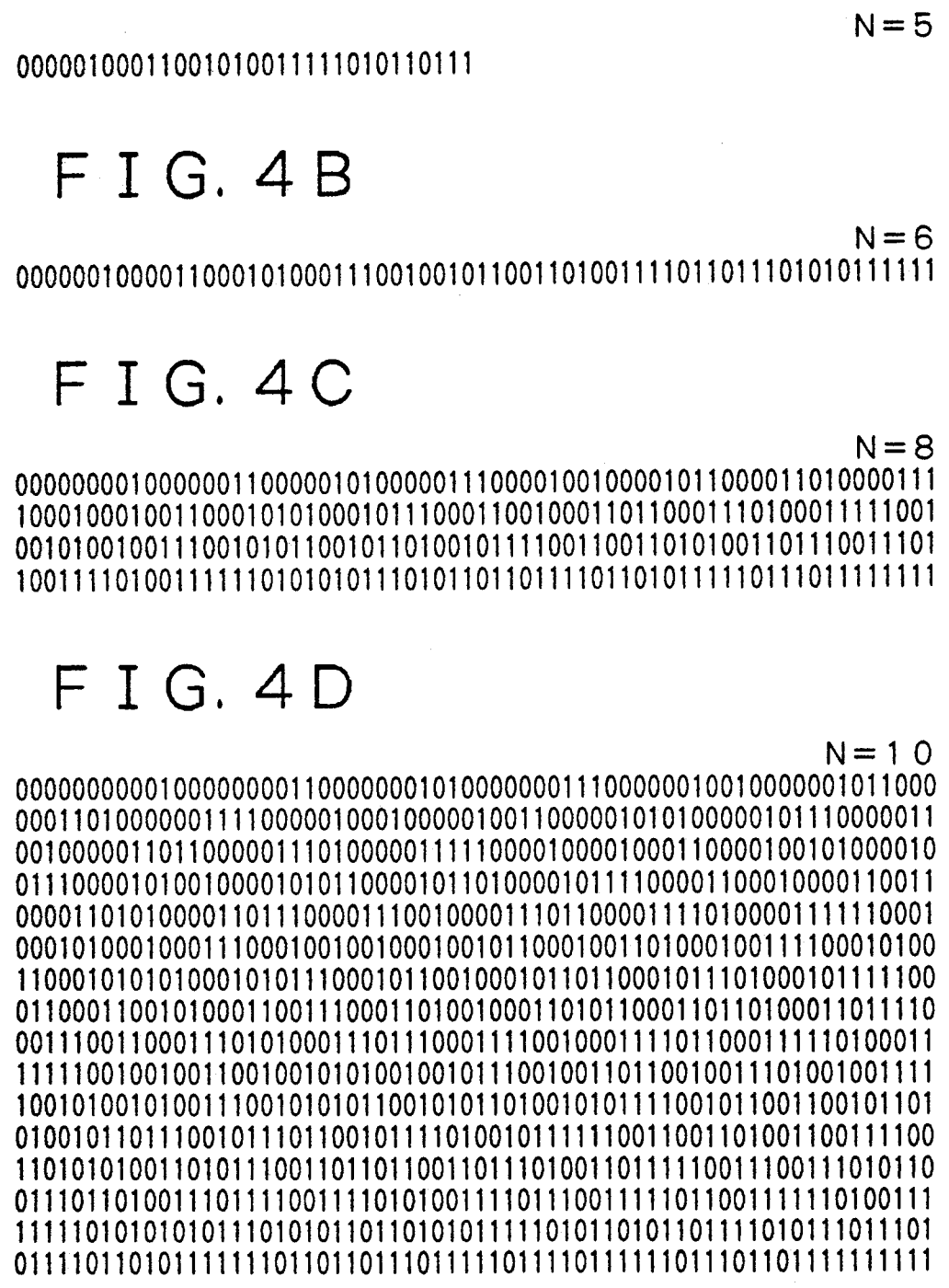

FIG. 4(a) shows a case in which binary graduations constitute a five-bit absolute code, that is, when N=5. FIG. 4(b) depicts a six-bit absolute code formed with binary graduations when N=6. FIG. 4(c) illustrates an eight-bit absolute code comprised of binary graduations when N=8. FIG. 4(d) shows a 10-bit absolute code made up of binary graduations when N=10.

FIGS. 4(b) to 4(d) each indicate a graduation arrangement in which the last graduation of each line actually continues uninterrupted to the first bit of the next line to form a single absolute code.

Where any of these graduation arrangements in FIG. 4 is applied to a rotary encoder, the last graduation of the last line is to continue uninterrupted to the first graduation of the first line to form a loop.

The embodiment of FIG. 4 represents the code array when each photodiode set of the absolute signal detector is continuously arrayed at a pitch corresponding to one half the minimum reading unit of the absolute pattern. When the pattern becomes fine such that the arraying pitch of the photodiode array cannot be made finer owing to dimensional limitations, the photodiodes can be arrayed at an interval of one graduation of the code array by ingeniously designing the code array of the absolute pattern. FIG. 5 shows, as an example, the array of binary graduations affording the absolute code for $N=10$. Since $N=10$, 10 sets each consisting of two photodiodes may be arrayed at an interval of one graduation for each set.

The absolute code may also be suitably set for other intervals. In general, the absolute code may be prepared with an integer multiple of the arraying pitch between the photodiode sets of the absolute code detectors.

The number of graduations for the absolute codes of FIGS. 4(a) to 4(d) are 32 with $N=5$, 64 with $N=6$, 256 with $N=8$ and 1024 with $N=10$, respectively. For actual usage, a more convenient number of graduations is frequently desired. FIGS. 6 to 11 show examples of the absolute codes having these practically desirable numbers of graduations.

Figures 6, 7:
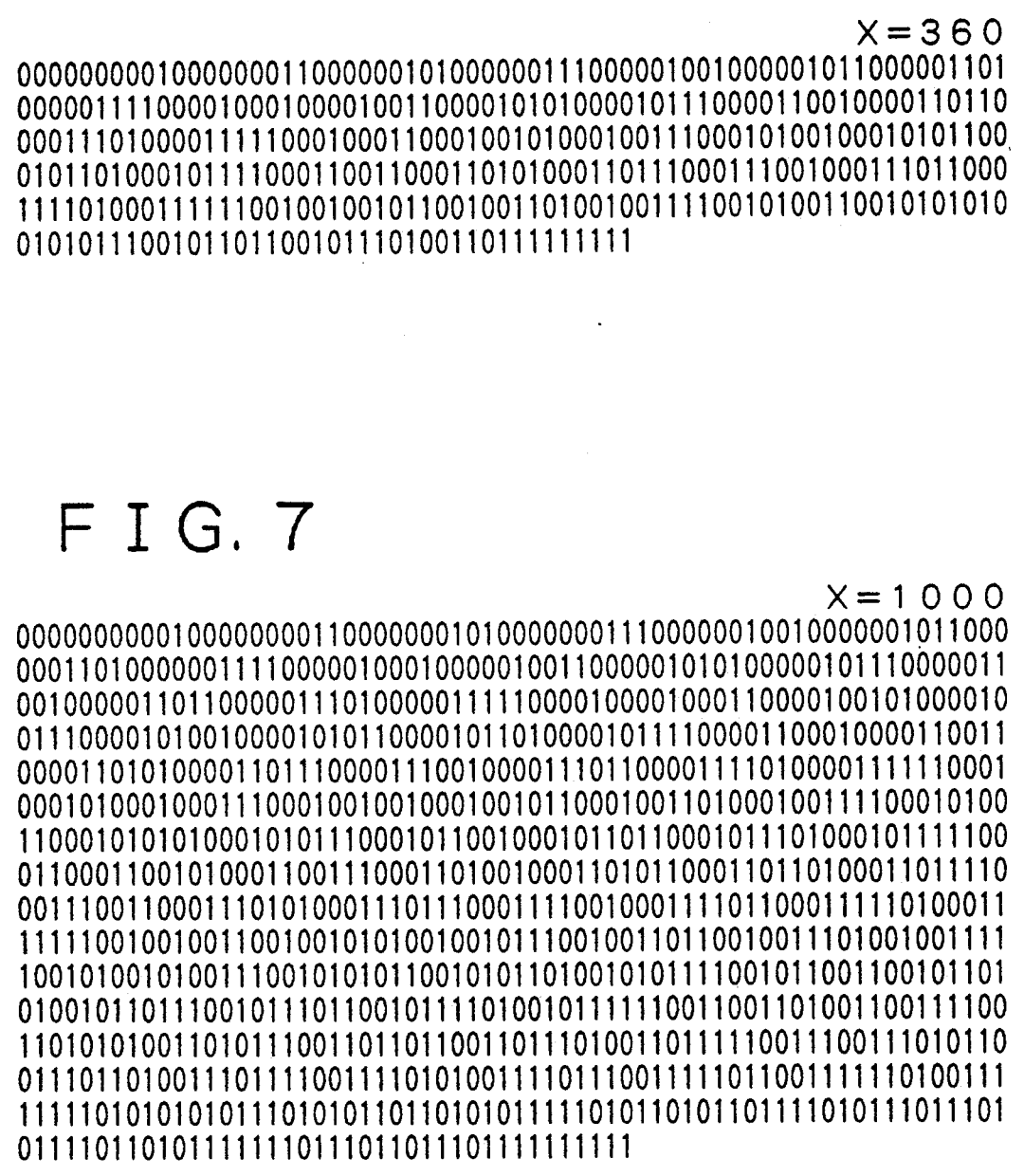
Figure 8:
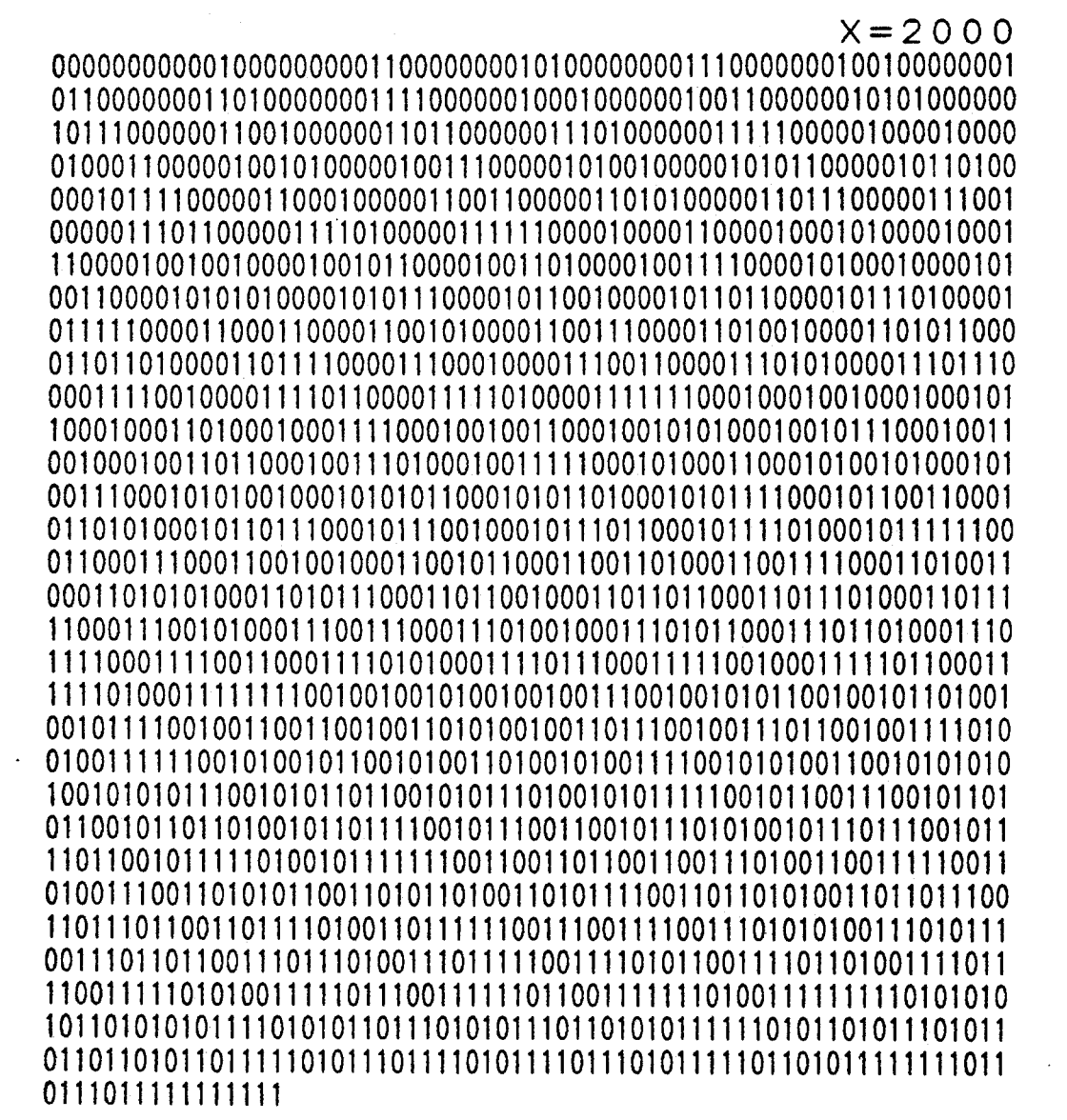
Figure 9A:
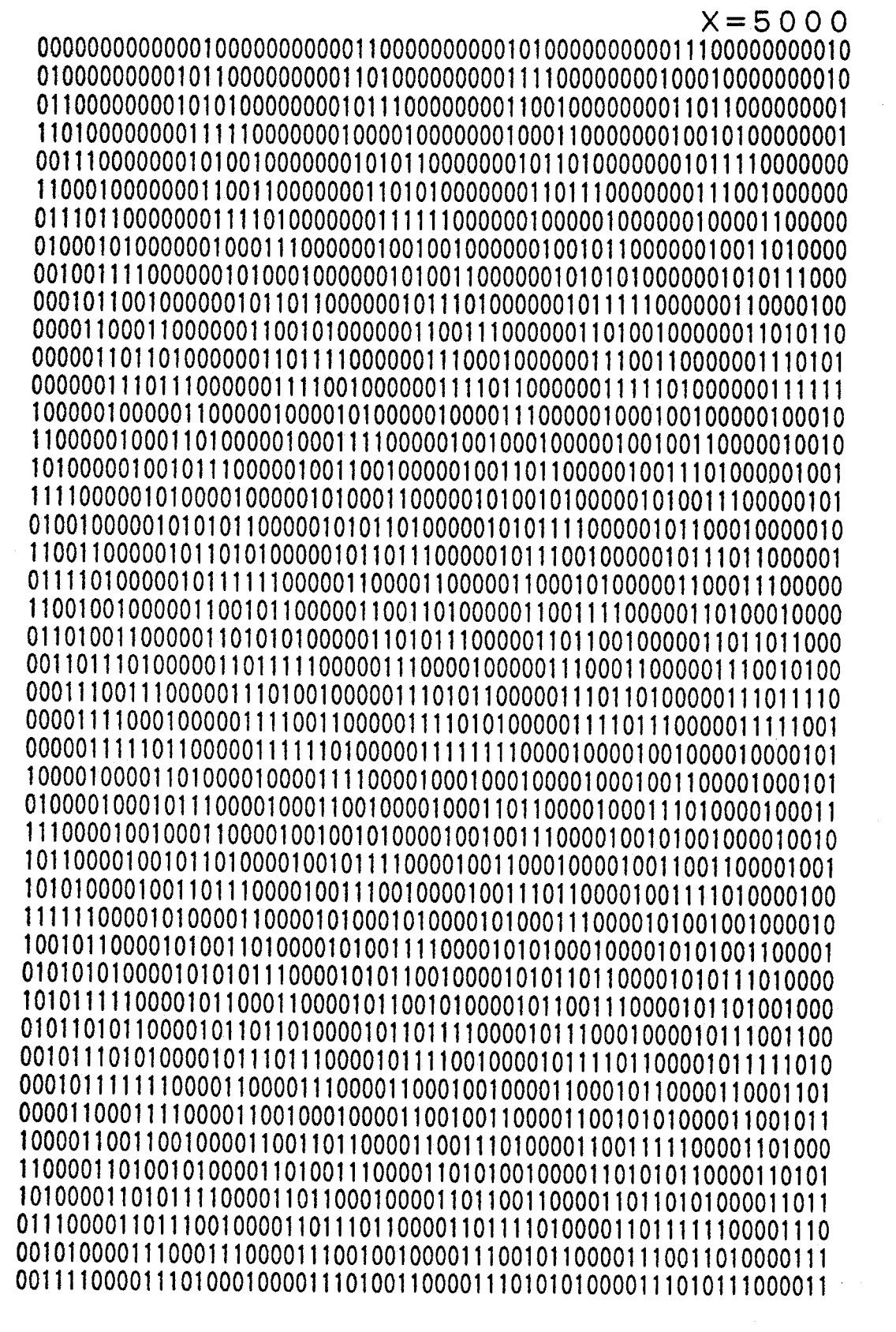
Figure 9B:
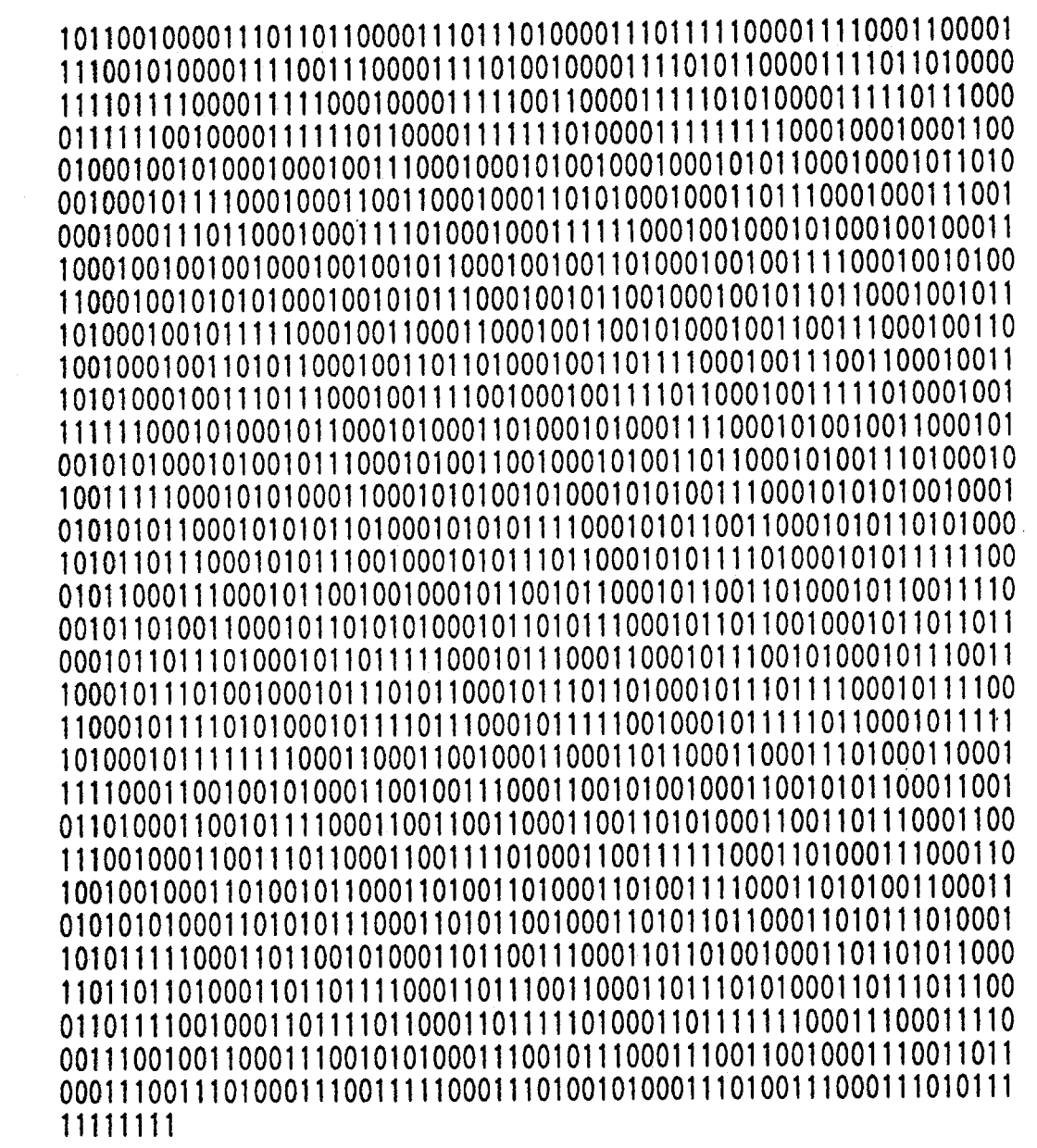
Figure 9:
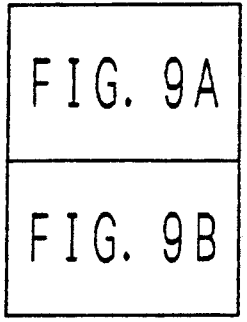
FIGS. 9A and 9B show an absolute code for the number of graduations equal to 5000.
Figure 10:
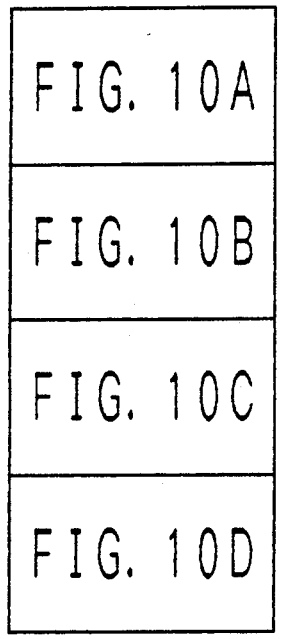
FIG. 10 shows a combination array of FIGS. 10A to 10C.
Figure 11:
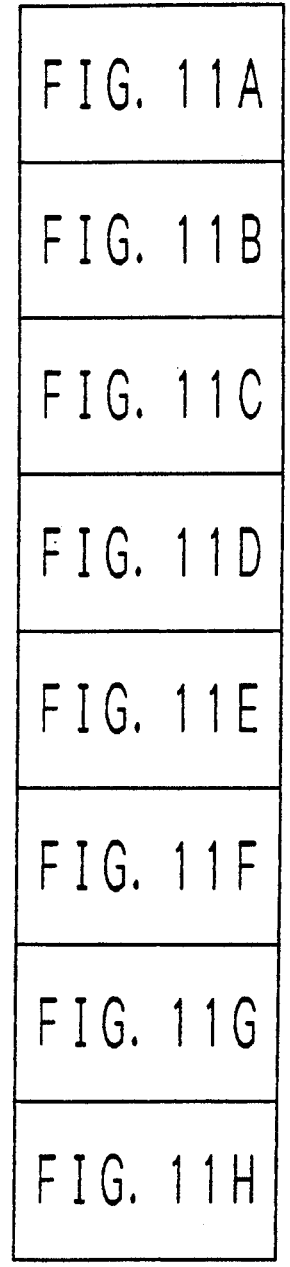
FIG. 11 shows the combination array of FIGS. 11A to 11F.
Figure 10A:
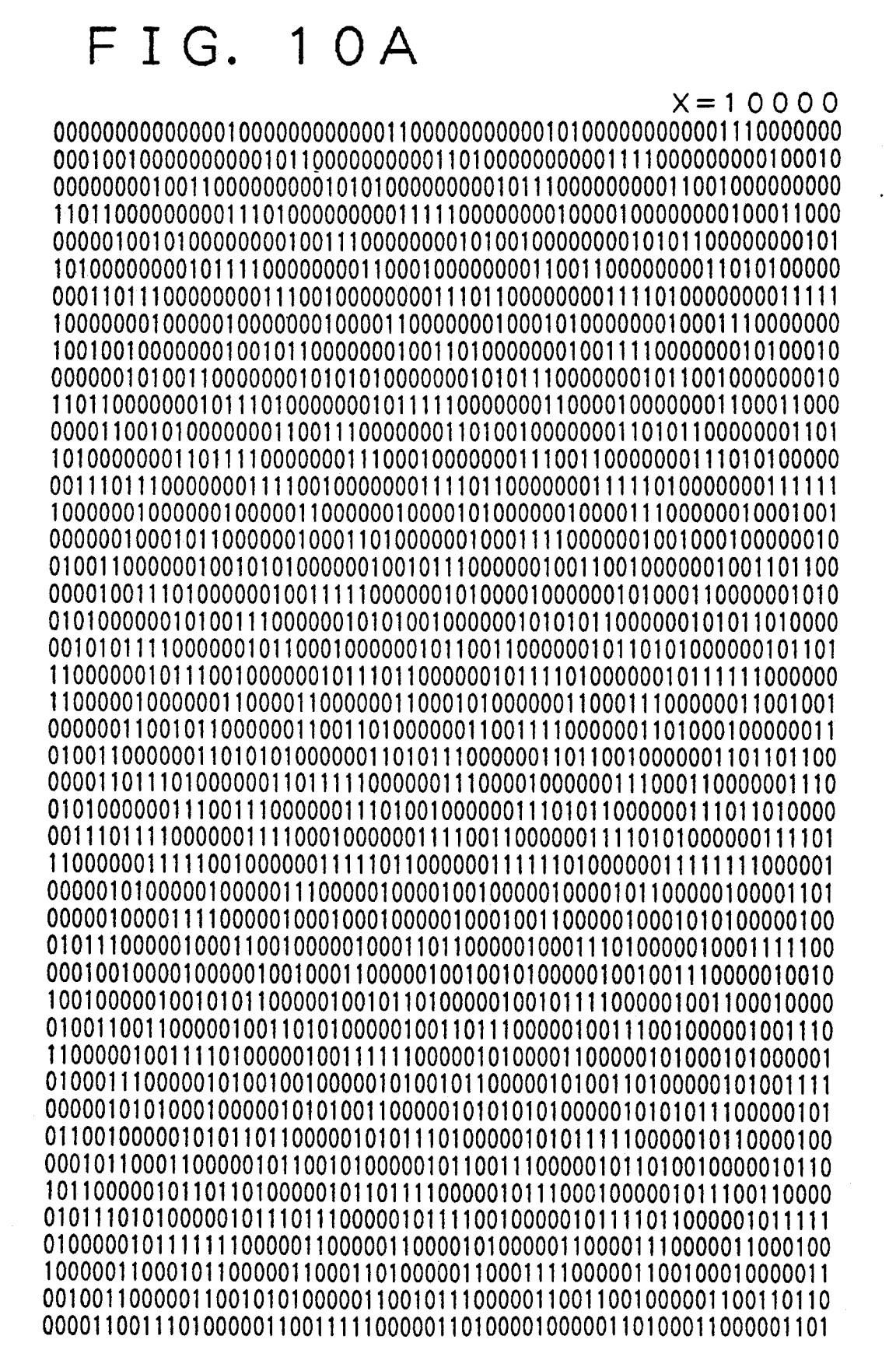
Figure 10B:
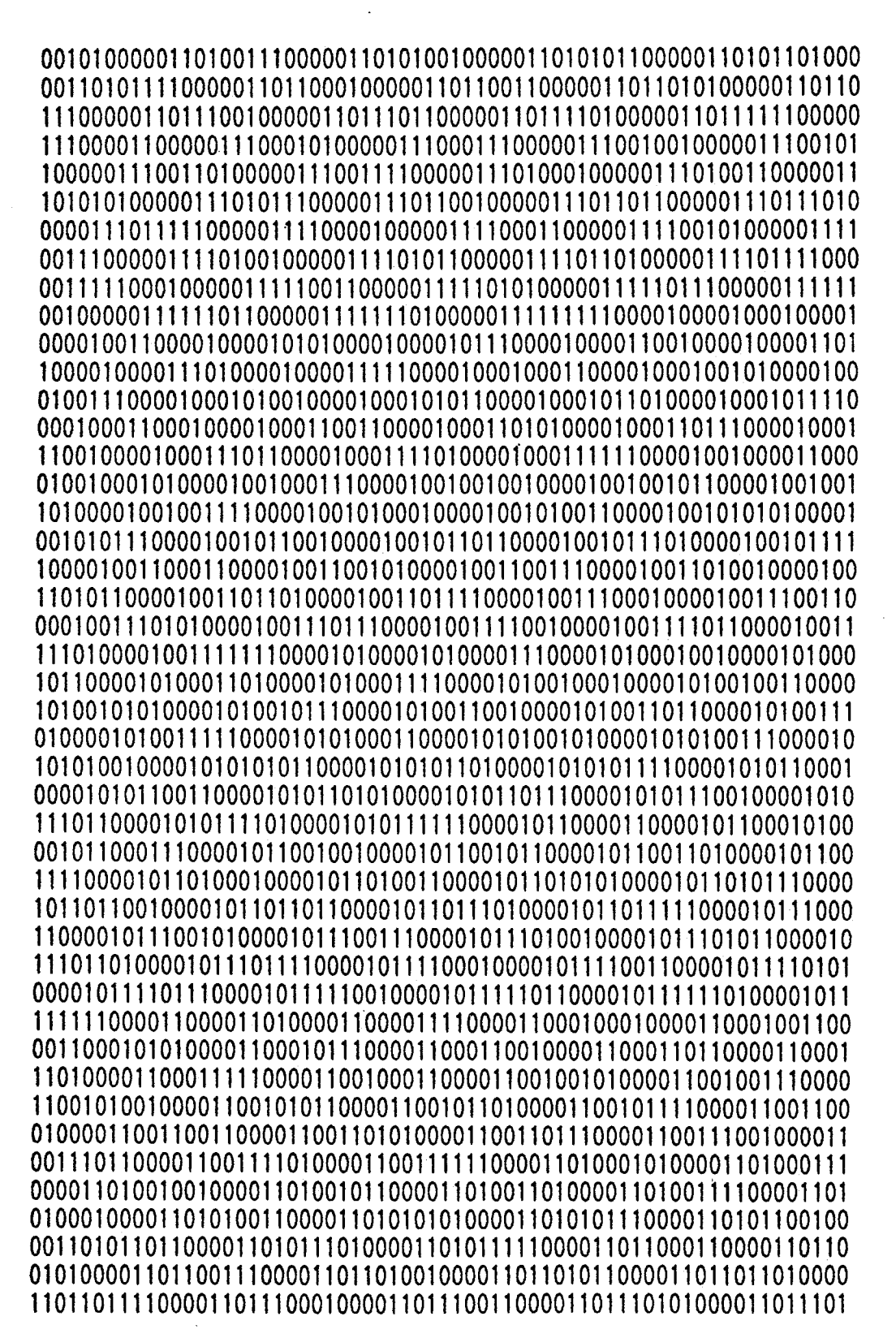
Figure 10C:
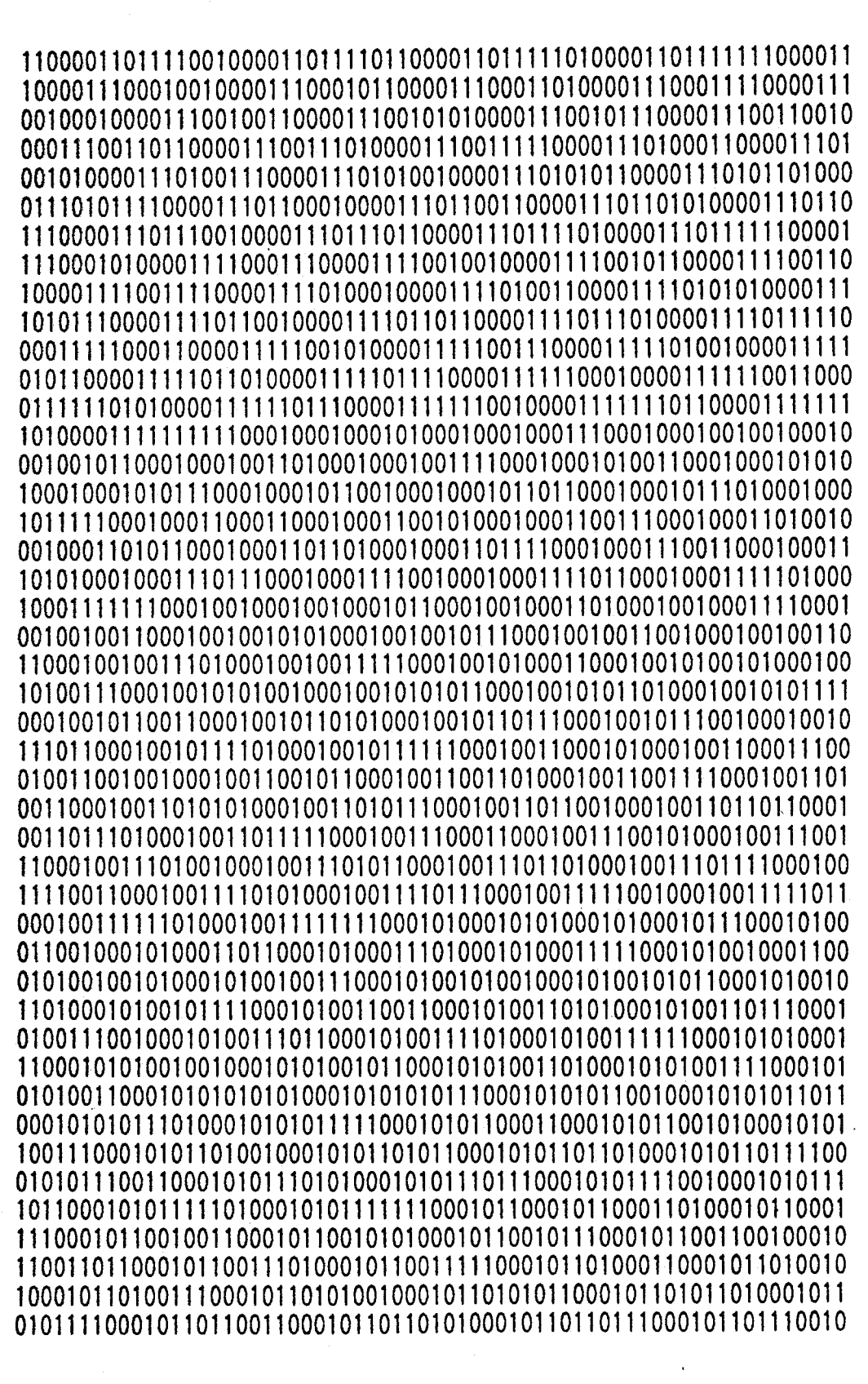
Figure 10D:
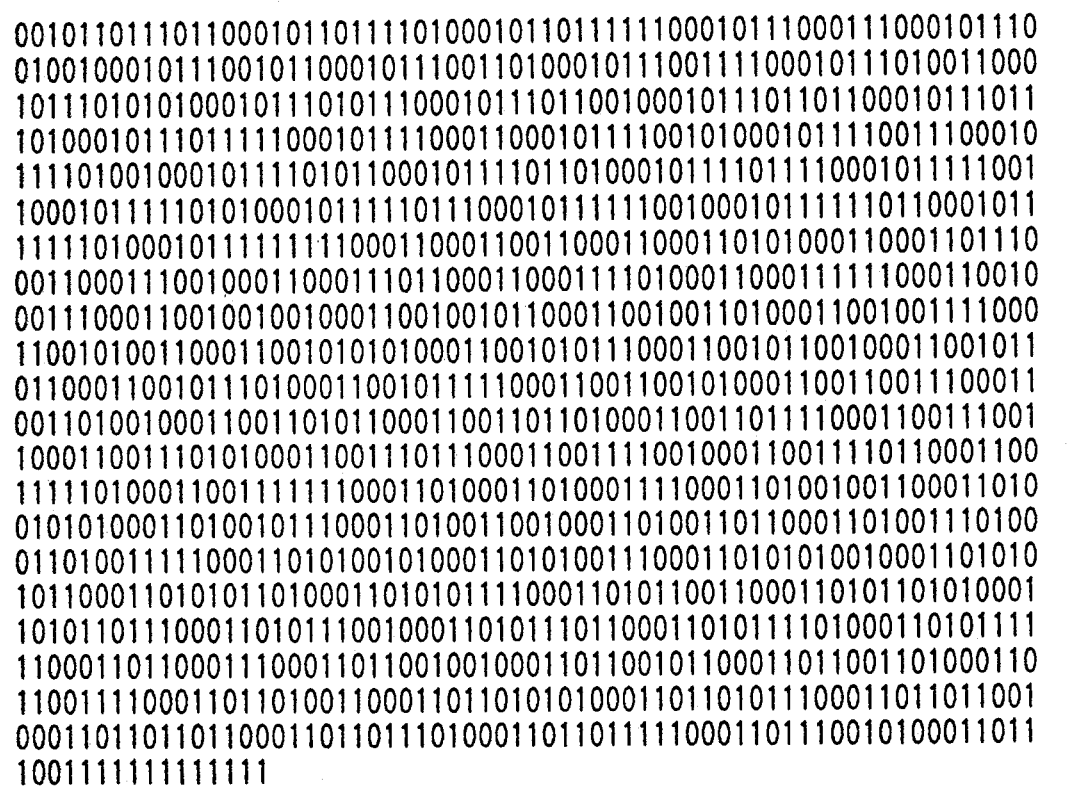
Figure 11A:
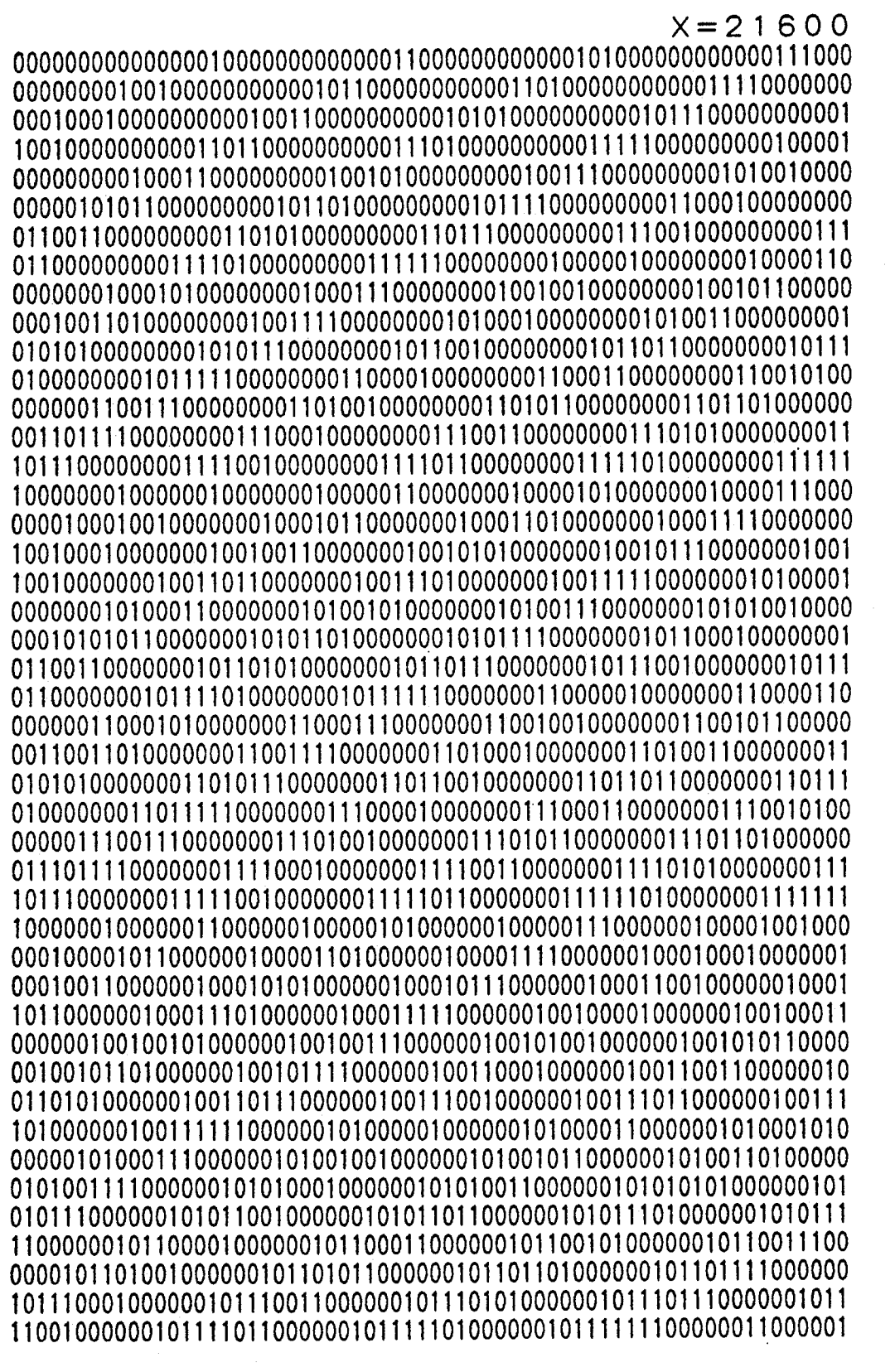
Figure 11B:
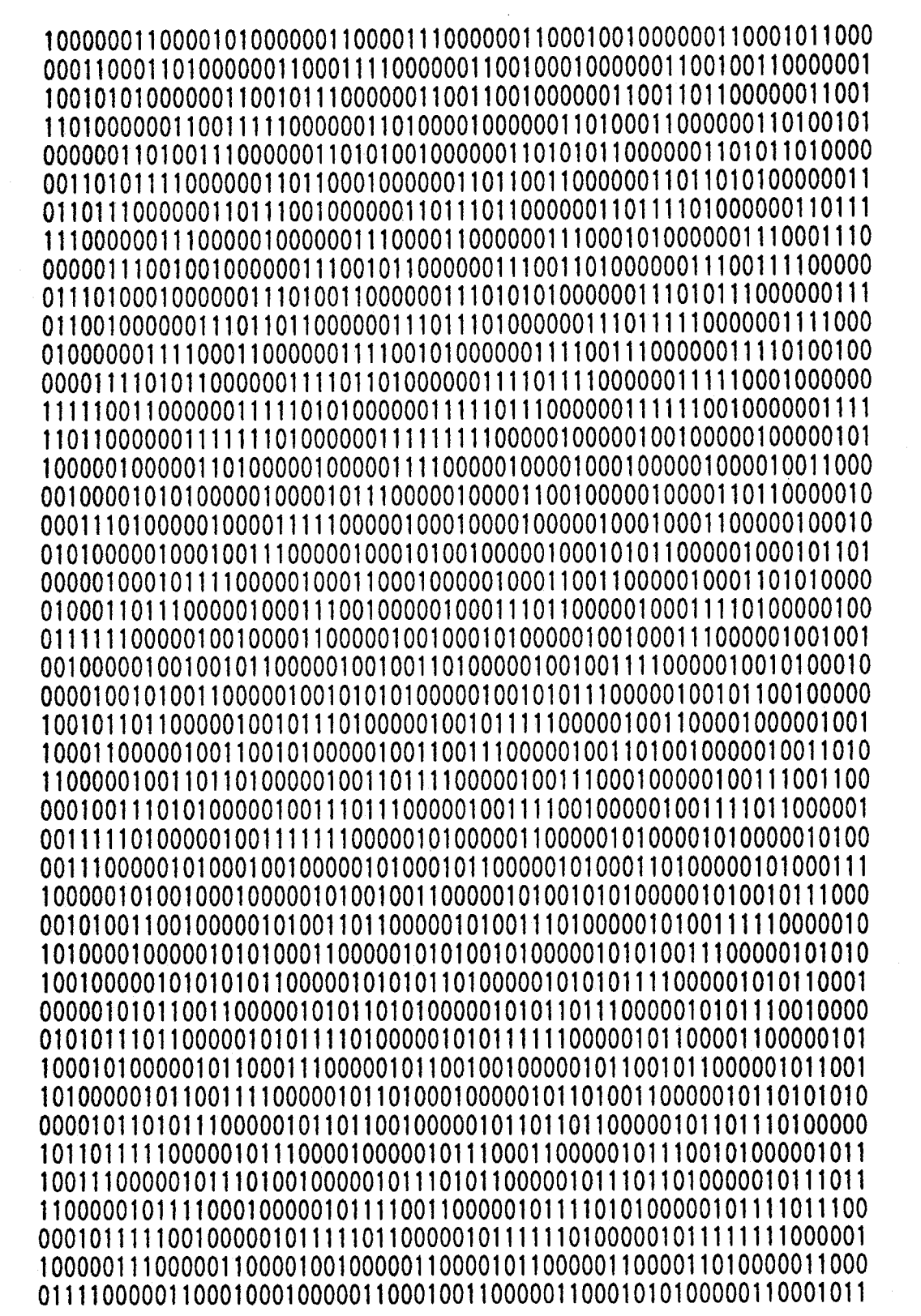
Figure 11C:
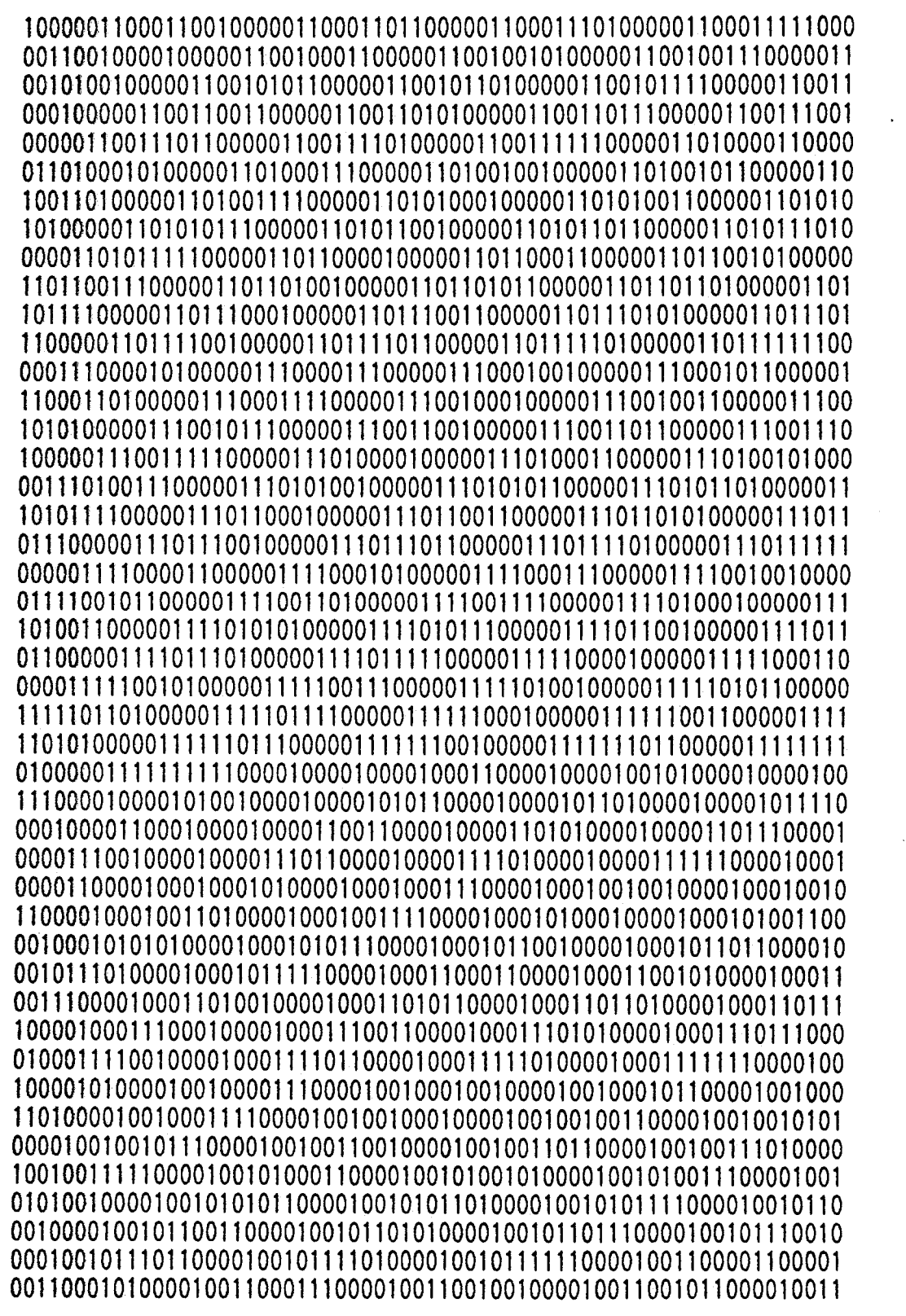
Figure 11D:
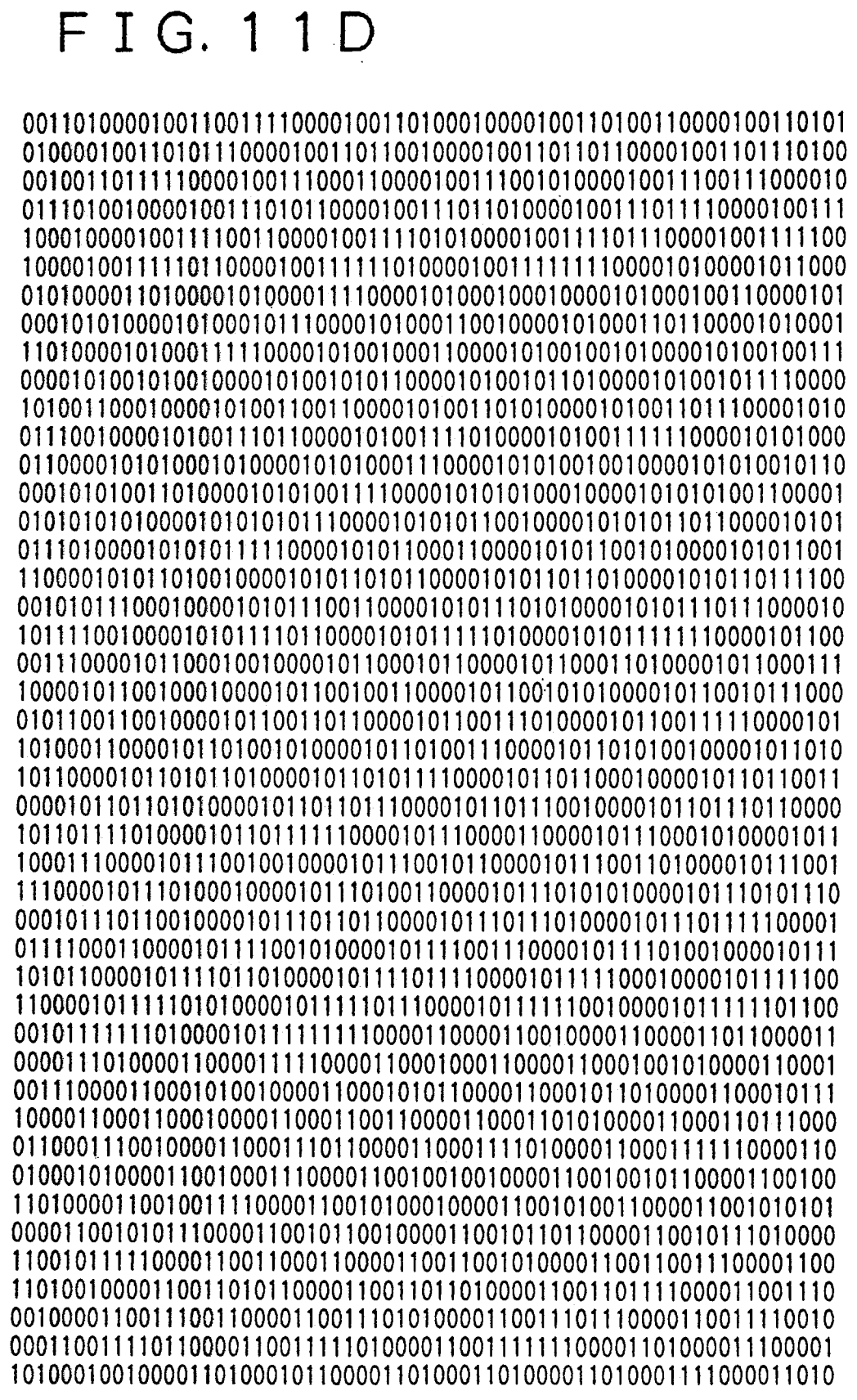
Figure 11E:
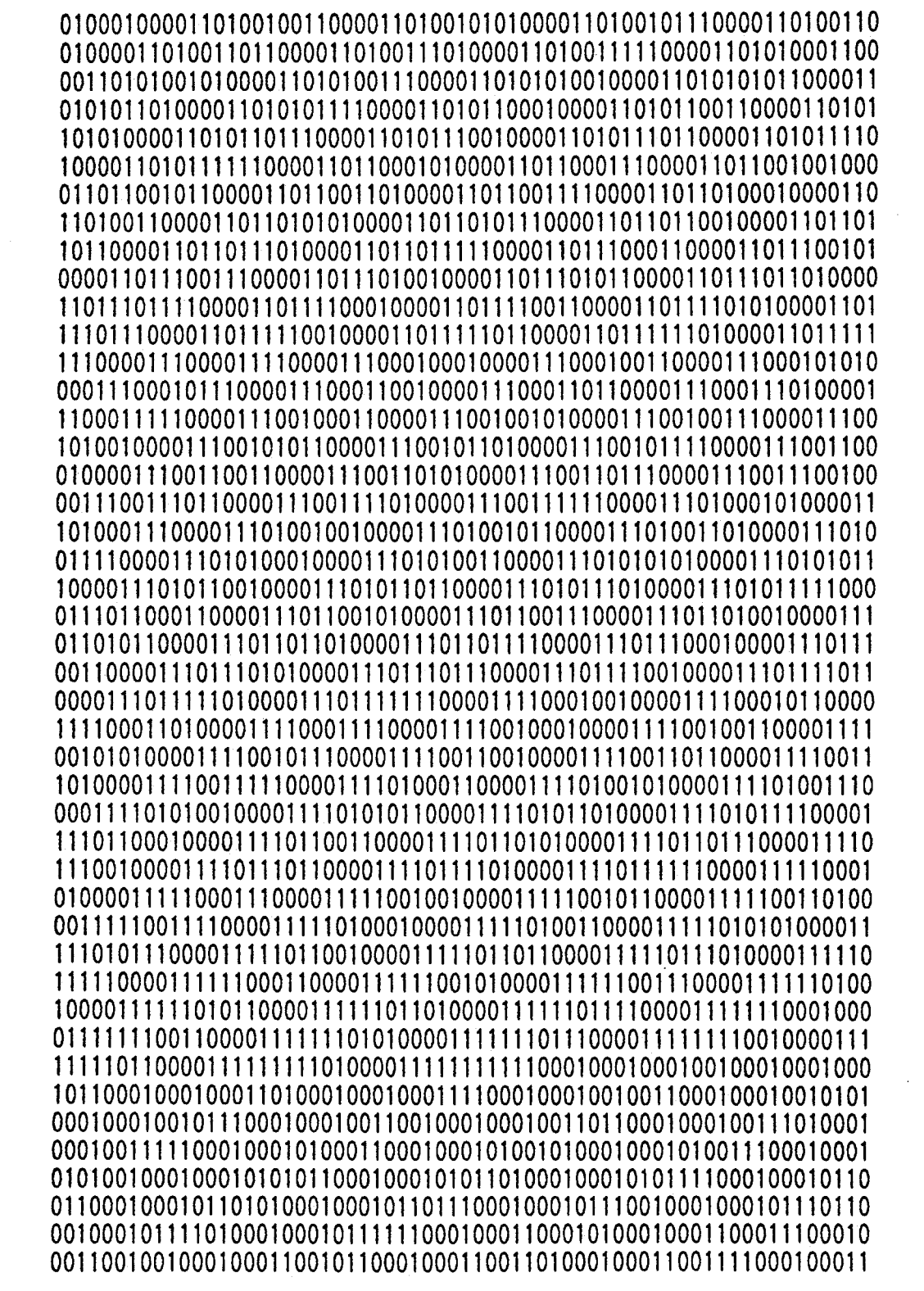
Figure 11F:
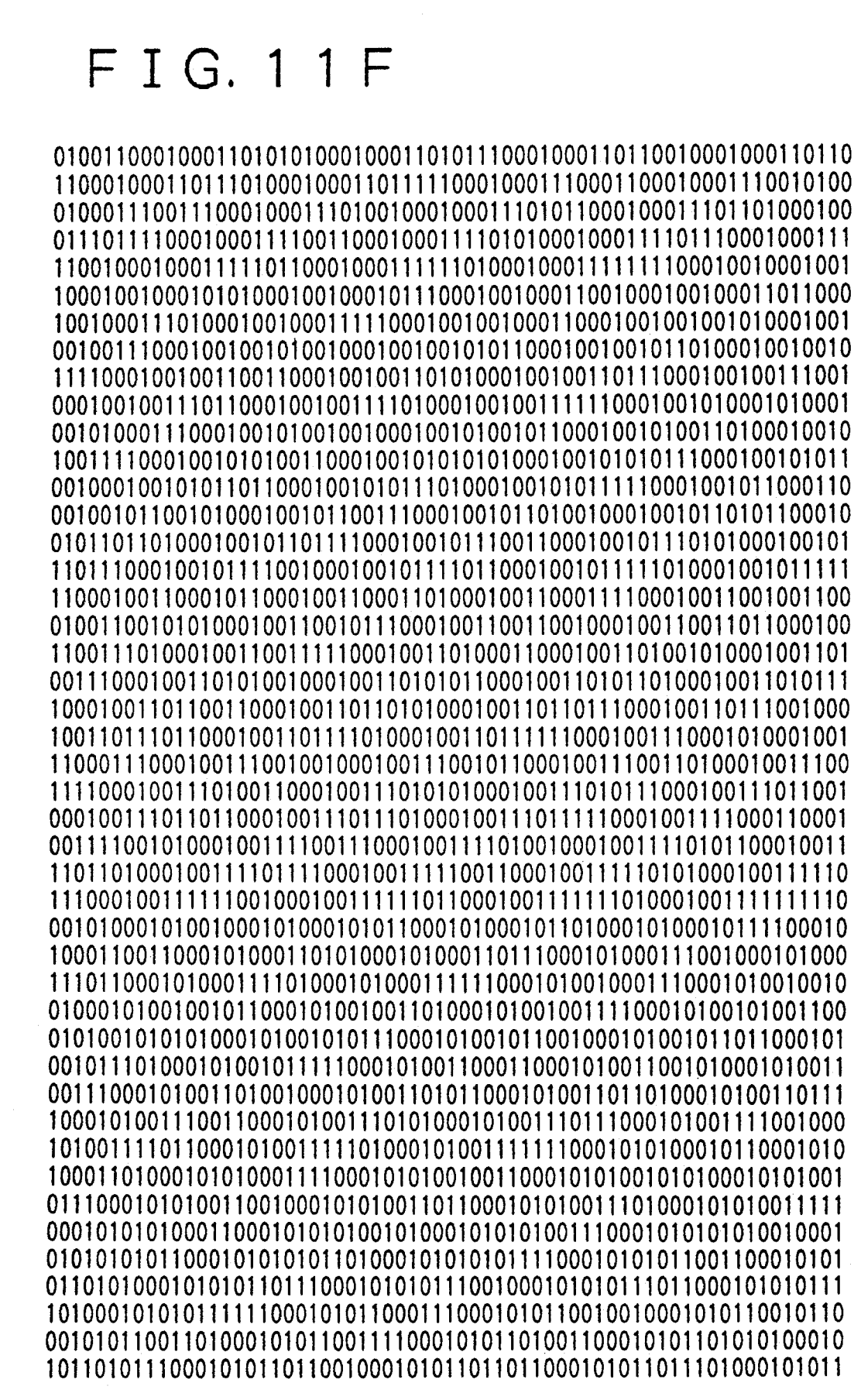
Figure 11G:
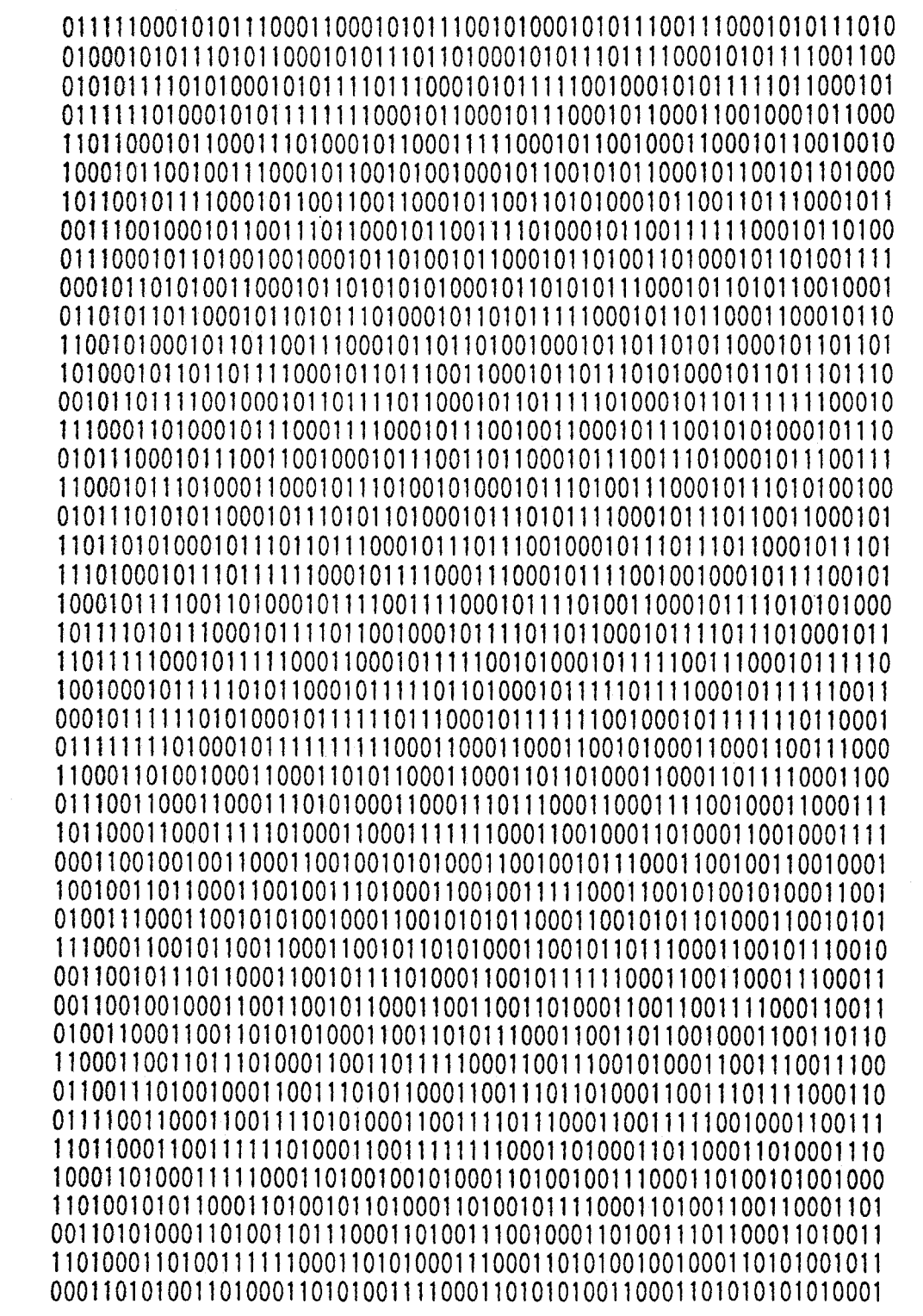
Figure 11H:
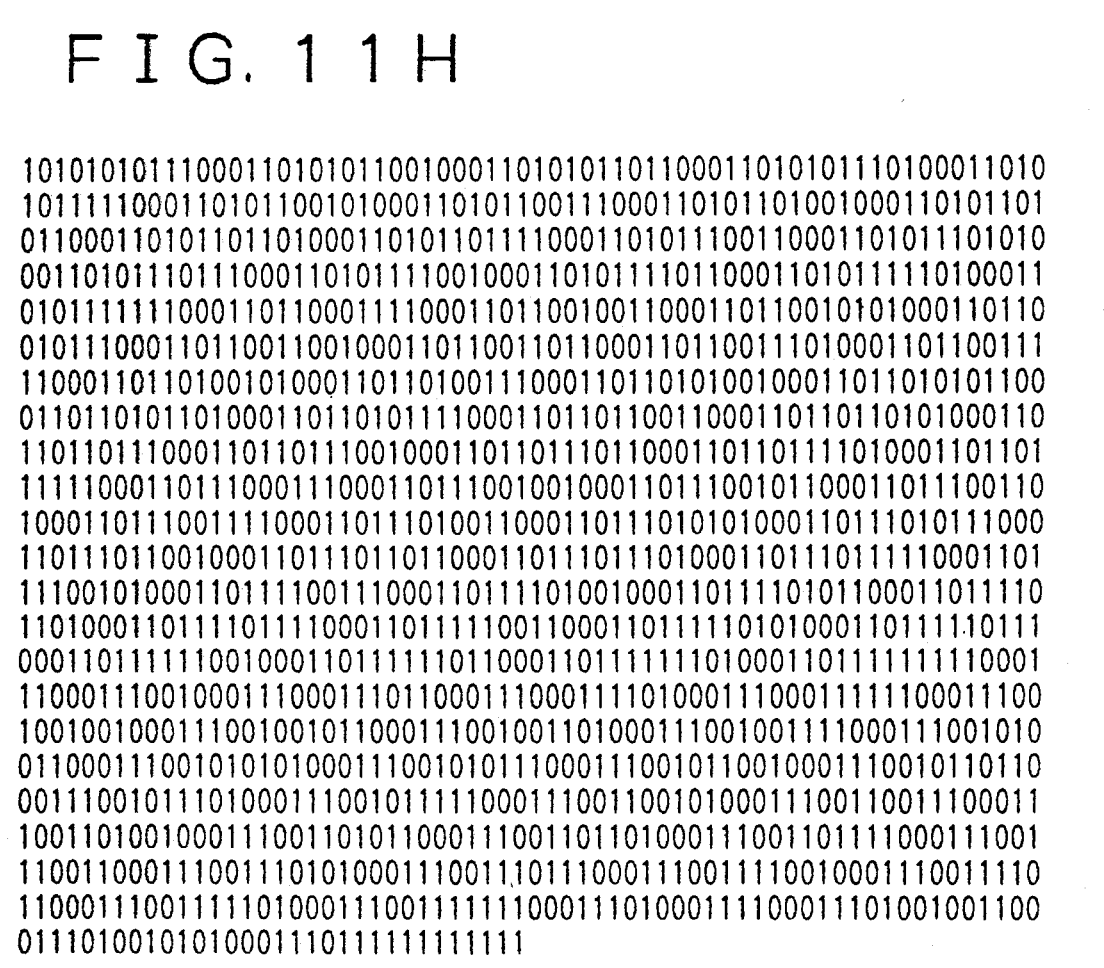

FIG. 6 shows an example of 360 graduations suitable for reading the angle by degrees as with a rotary encoder, FIG. 7 an example of 1000 graduations, FIG. 8 an example of 2000 graduations and FIG. 9 an example of 5000 graduations. FIGS. 10A to 10C show an example of 10,000 graduations and FIGS. 11A to 11F show an example of 21,600 graduations suitable for reading the angle by minutes.

Using any of the graduation arrangements described above, it is possible to implement an absolute pattern on a single track. This means that an absolute encoder according to the present invention may be virtually the same in size as the comparable incremental encoder.

In addition to the rotary encoder whose preferred embodiment has been described above, the present invention may also be applied to a linear encoder for reading locations along a straight line setup. In this case, a coder that moves relative to detectors may have an absolute pattern formed linearly in the direction of the relative movement. The invention may be applied not only to optical type encoders, as in the embodiment described above, but also to magnetic type absolute encoders and others that operate on different detection principles.

Second Embodiment

Figure 12A:
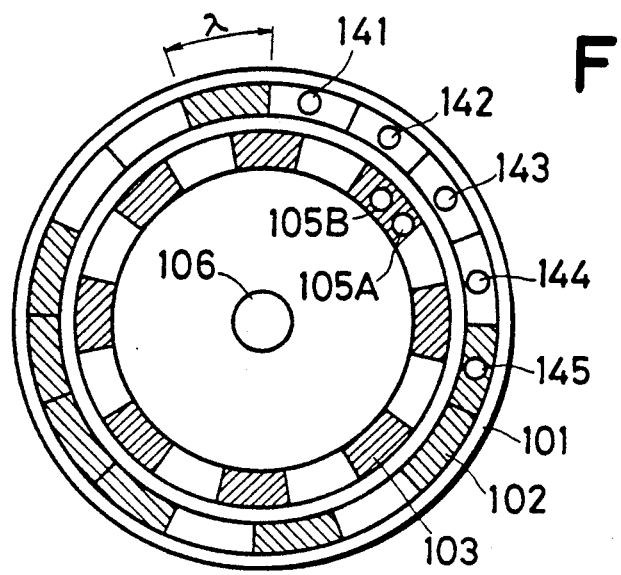
FIG. 12A schematically shows a disk-shaped coder of an optical rotary absolute encoder according to a second embodiment of the present invention.
Figure 12B:
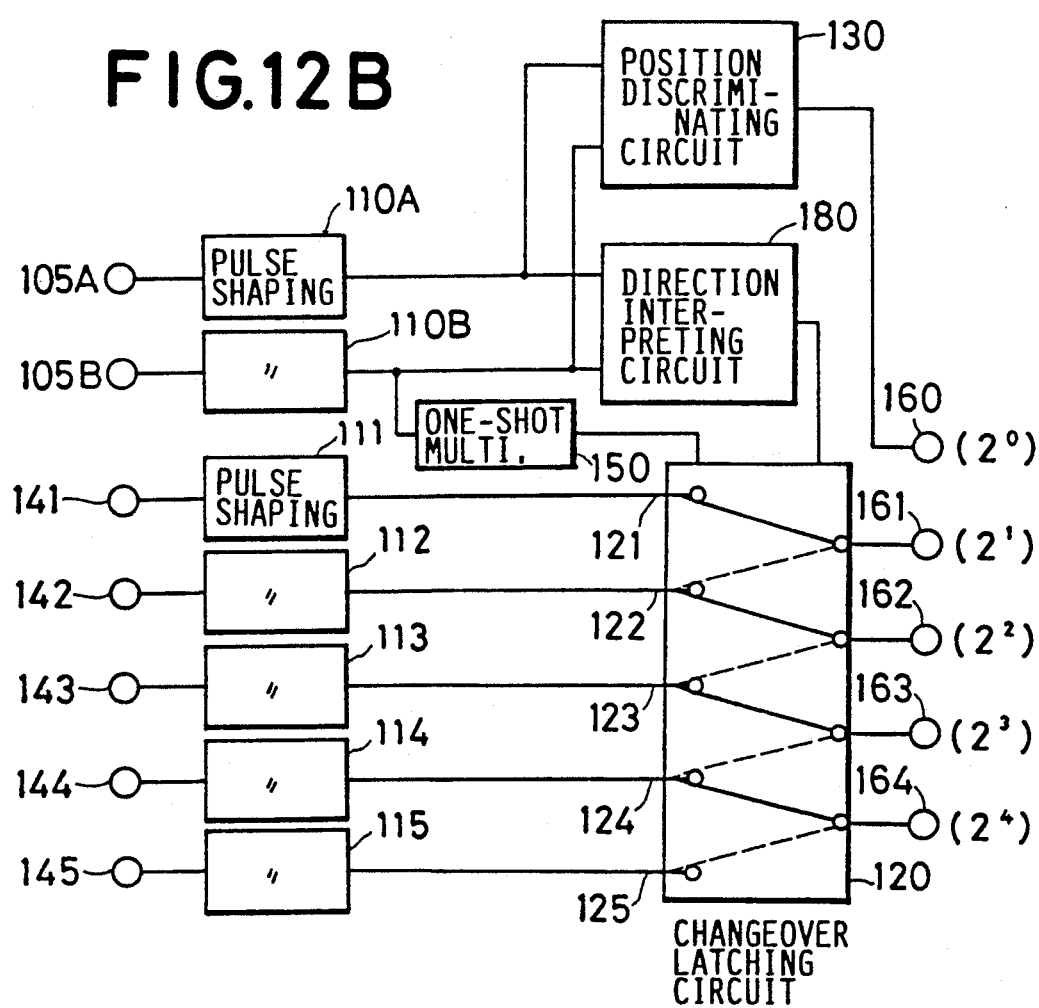
FIG. 12B shows an example of a signal processing circuit for processing the detection output of the detector associated with the coder of FIG. 12A.

FIGS. 12A and 12B illustrate an embodiment of the present invention wherein an optical type absolute encoder operates using photoelectric conversion elements as detectors.

In FIG. 12A, a coded disk 101 has a first circular track 2 and a second circular track 103, disposed concentrically. The first circular track 102 has an absolute pattern comprising graduations of 0s and 1s represented by transparent and opaque parts, respectively. The second circular track 103 has an incremental pattern formed by 16 equally divided parts, with opaque and transparent parts appearing alternately.

The absolute pattern formed on the first circular track 101 provides a four-bit absolute code signal in a fully periodic array. The code signal is comprised of 16 equally divided parts of the circumference of the track (1 division equals $\pi/8$ rad.) The first circular track 102 in FIG. 12A comprises, clockwise from the 12 o'clock position: four contiguous "0", or transparent, graduations; two contiguous "1", or opaque, graduations; a single "0", or transparent, graduation; a single "1", or opaque, graduation; a single "0", or transparent, graduation; four contiguous "1", or opaque, graduations; two contiguous "0", or transparent, graduations; and a single "1", or opaque, graduation. That is, the scale of this pattern is formed as 0 0 0 0 1 1 0 1 0 1 1 1 1 0 0 1

FIG. 12A, $\lambda$ denotes the length of a single graduation on the scale along the track 102. Since the number of graduations in the embodiment of FIG. 12A is 16, one graduation is equivalent to 22.5 degrees ($=360/12;\pi/8$ rad.)

The second, inside track 103 has an incremental pattern which provides a clock signal for synchronization between the interpreting signal and the process of serial-parallel data conversion described above. The track 103 comprises 16 equally divided parts, opaque and transparent parts appearing alternately, each equaling the length of a single graduation $\lambda$ (angle range). The 16 graduations thus constitute the incremental pattern.

The coded disk 101 comprises optical sensors 141, 142, 143, 144, 145, 105A and 105B, each having a light source and a photoelectric conversion element located opposed across the disk. The coded disk 101 and the detectors are allowed to rotate relative to one another around a rotation axis center 106. These detectors consist of five photosensors 141, 142, 143, 144, 145 for reading out the absolute pattern arrayed along the first circular track 102 at a pitch of $\lambda$ and a pair of photosensors 105A, 105B for reading out the incremental pattern arrayed along the second circular track 103 at a pitch of $\lambda/2$. The absolute pattern reading sensors may be arrayed at an interval equal to C times the unit dimension $\lambda$, C being an integer. Similarly, the incremental pattern reading sensors may be arrayed at an interval equal to $(C*\lambda+\lambda/2)$.

FIG. 12B shows an example of a signal processing circuit for processing the detection outputs of the photosensors 141 to 145 and 105A, 105B.

The detection outputs of the photosensors 141 to 145 are waveform shaped by pulse shaping circuits 111 to 115 into pulse trains formed by rectangular wave signals before being input to each of the input terminals 121 to 125 of a changeover latching circuit 120.

Meanwhile, a phase A signal, output from the optical sensor 105A, and a phase B signal, output from the optical sensor 105B, are rectified likewise by a pulse shaping circuit 110A and a pulse shaping circuit 110B, respectively. The signals enter a direction interpreting circuit 180. The interpreting circuit 180 supplies "1" to the changeover latching circuit 120 when the phase A signal leads the phase B signal; the circuit 14 supplies "0" to the circuit 120 when the phase B signal leads the phase A signal.

The position discriminating circuit 130 constitutes sub-scale signal producing means for producing the aforementioned sub-scale signals from the phase A signal and the phase B signal. Thus the circuit outputs "0" when the logical state of the phase A signal is the same as that of the phase B signal, while outputting "1" otherwise, this output being taken out as the sub-scale signal at the output terminal 160. Such a circuit function may be implemented by, for example, an exclusive OR circuit.

A one-shot multivibrator 150 is designed to produce clock signals from the increment signals of the A or B phase signals. When triggered by both the rise and fall edges of the phase A signal, the monomultivibrator generates pulses of narrow pulse widths at the respective trigger timing. These pulses are input to the changeover latching circuit 20 at clock pulses corresponding to each of the reading units obtained by dividing the perimeter of the coder 101 into 16 equal sections. In this case, the timing for the multivibrator triggering signal (phase A signal) to rise and fall is preferably synchronized with the approximate center of the pulse width of a unit pulse width corresponding to the minimum reading unit of the pulse train input to each input terminal of the latching circuit 120. In this manner, the readout timing of the high or low level of the input pulse train at the changeover latching circuit 120 is set so as to be at a stable time juncture at substantially the midpoint of the unit pulse width spaced apart from the rise and fall of the rectangular wave of the pulse train to prevent readout of erroneous contents. The appropriate timing is readily selected by suitably determining the phase difference between two trackdetector disposition combinations: one comprising the absolute pattern track 102 and the detectors 141 to 145, and the other formed by the incremental pattern track 103 and the detectors 105A and 105B.

Each time the aforementioned clock pulse arrives at the changeover latching circuit 120, the circuit latches and outputs the high and low levels of the rectangular wave signals at the input terminals 121 to 125. At this time, depending on the signal from the direction interpreting circuit 180, four of the five inputs are selectively switched as shown by the solid lines or broken lines in FIG. 12B so as to be connected to the output terminals. That is, when the direction interpreting signal is "1", the input terminals 121, 122, 123 and 124 are connected to the output terminals 161, 162, 163 and 164 for latching and outputting the pulse trains from the sensors 141 to 144 at the clock timing. When the moving direction is reversed so that the direction interpreting signal is "0", the pulse trains from the sensors 142 to 145 are output after latching at the clock timing. At the four output terminals 161, 162, 163, 164, there is obtained a 4-bit parallel data output at the clock pulse timing on the basis of the aforementioned absolute signal. At the output terminal 160 corresponding to the bit lower than the least significant bit represented by the output terminal 161, there is obtained the sub-scale signal from the position discriminating circuit 130. In this manner, a 5-bit binary code signal having a different combination of "0"s and "1"s at each rotational angle of $\pi/16$ radian of the coder 101 is obtained at the five output terminals 160 to 164.

FIG. 13 shows the state of the changeover latching operation of the changeover latching circuit 120 and the output pulse trains of the sensors at the time of the direction inversion. When the track 102 of the coder 101 is moved leftwards in the drawing with respect to the stationary sensor (FIG. 12A), counterclockwise rotation of the coder 101 represents the positive (+) direction, and the opposite rotation represents the reverse (−) direction.

It is assumed in FIG. 13 that A, B, C, etc. on the absolute track 102 represent "0" or "1" of the minimum reading unit of the absolute pattern. As shown at the lower side of the absolute track 102, the clock pulses from the one-shot multivibrator 150 arrive as shown at a, b, c, d, e, f, at such a timing that the rise thereof corresponds to the central position of the minimum reading unit of the absolute pattern during movement of the coder in the positive direction, while arriving as show at f', e', d', c', b', a', during movement of the coder in the opposite direction.

During coder movement in the positive direction, the changeover latching circuit 120 latches the pulse trains from the sensors 141 to 144 by the clock pulses a, b, c, d, e, f, before outputting the latched pulse trains. During the coder movement in the opposite direction, the pulse trains from the sensors 142 to 145, deviated each by one sensor, are latched by the clock pulses f', e', d', c', b', a' before being output at the output terminals 161 to 164. Meanwhile, the position discriminating circuit 130 alternately outputs, in timed relation with the clock pulses, exclusive OR outputs "1" and "0" of the phase A and phase B signals, for dividing the unit pulse width appearing at the output terminal 161 into two portions. This state is also shown in FIG. 13.

It is assumed that the track 102 is moved leftwards in FIG. 13 with respect to the sensor. When the sensor 145 arrives at the position A of the track 102, detected values B, C, D and E of the sensors 144, 143, 142, 141 latched with the clock a by the changeover latching circuit 120 are output at the output terminals 164, 163, 162, 161, while the sub-scale signal "1" from the position discriminating circuit 130 is output at the output terminal 160. This state is shown at (1) in FIG. 13. The contents of the output terminals when the sub-scale signal at the output terminal 160 becomes "0", with the movement along the positive direction of the track 102 from this state, are as shown at (1a) in FIG. 13. The contents at the output terminal by the latching operation at the next clock b, with the movement along the positive direction of the track 102, are as shown at (2) in FIG. 13. The address code corresponding to the sensor position at this time is "CDEF1".

The end sensor 145 takes hold on track 102 of B, corresponding to the data the sensor 144 has passed by, as shown in FIG. 13, and outputs data B. When the coder is inverted in this state shown at (2) and moved in the reverse (negative) direction, the changeover latching circuit 120 is switched to the connection state shown by the broken line in FIG. 12B, by the interpreting signal from the direction interpreting circuit 180. The values B, C, D and E of pulses from sensors 142 to 145 are latched by clock pulses b' arriving directly after inversion, the output of the circuit 130 is changed from "1" to "0" and the respective output terminals assume the state "BCDE0" shown at (3). Then, when the sub-scale signal from the circuit 130 become "1" with the movement in the negative direction, the output terminals become "BCDE1" as shown at (3a) in FIG. 13. Then, with the clock"a", "ABCD0" is output sequentially as shown at (4). In this manner, correct encoder outputs may be permanently produced at the output terminals 160 to 164.

In the embodiment of FIG. 12A, the absolute pattern on the first circular track 102 of the coder 101 is for N=4, so that the absolute code is $2^N=16$ graduations. As shown in FIG. 12A, the array of the absolute pattern (absolute code) on the track 102 is so set that, when the four adjacent graduations are shifted circumferentially of the coder 101 each by one graduation, the code signals of the same "0, 1" combination are not produced in the adjacent graduations throughout one coder revolution, so that the absolute code may be expressed as 0 0 0 0 1 1 0 1 0 1 1 1 1 0 0 1 as mentioned above.

Figure 14:
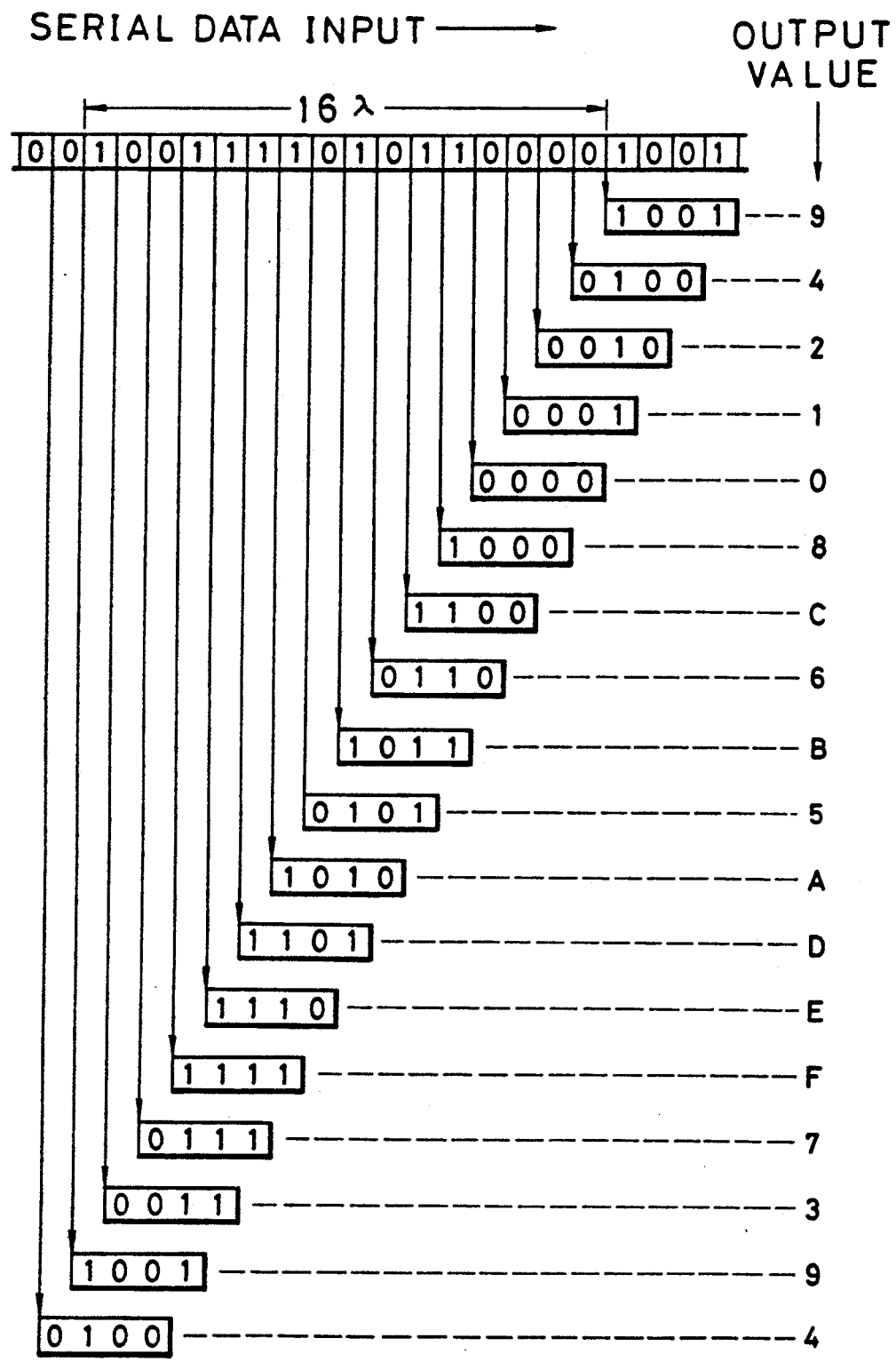
FIG. 14 shows the state of code conversion of the readout data of the absolute encoder according to the second embodiment.

Thus, when the output terminals 161, 162, 163, 164, are allotted to $2^1$, $2^2$, $2^3$ and $2^4$, respectively, absolute signals are obtained, which are represented by 4-bit binary numbers having different contents every $\pi/8$ radian of the angle of relative rotation. In FIG. 14, hexadecimal numbers corresponding to the respective absolute numbers are affixed as output values on the right side. It will be seen that if the 4-bit binary code signals for the neighboring four graduations of FIG. 14 are expressed directly as numerals, they prove to be 16 hexadecimal numbers, for which the resolution is 360/16 degrees. If the signals "0", "1" from the circuit 130 are annexed to the lower order side corresponding to the four neighboring bits of the absolute signal, there are produced at the five output terminals 160 to 164 absolute signals expressed by the five-bit binary numbers having different contents every $\pi/16$ radian of the angle of relative rotation. The total number of graduations of the outputs is doubled so that 32 hexadecimal numbers are produced, with the resolution being doubled to 360/32 degrees. The same number is not assumed at any position when the coder 101 makes one complete revolution, so that it is seen that the absolute encoder is constituted.

Although the above-described second embodiment is mainly directed to a rotary encoder for reading the rotational position, the present invention may also be applied to a linear encoder for reading the linear position, in which case the absolute pattern is formed linearly along the direction of relative movement. The present invention may be applied not only to the optical type system described in the embodiment, but may be applied to a magnetic absolute encoder. The method of detecting the absolute signal may also be by a serial/parallel data conversion system rather than the latching system.

Third Embodiment

Figure 15:
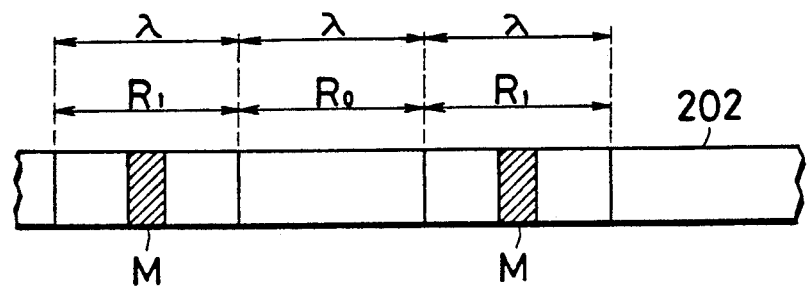
FIG. 15 diagrammatically shows a portion of the coder according to a third embodiment of the present invention.
Figure 16:
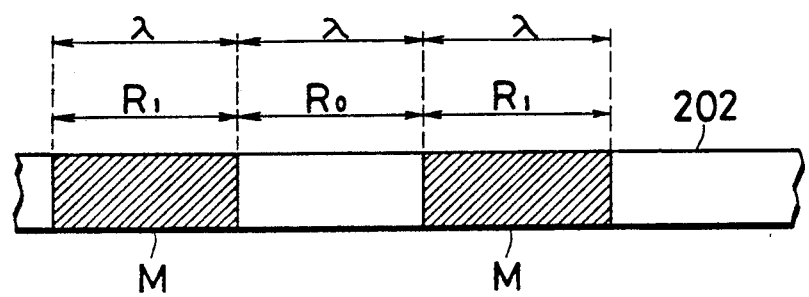
FIG. 16 diagrammatically shows a portion of a conventional coder for comparison with FIG. 15.

A third embodiment is now explained, in which a magnetoresistive MR element is used as the detector associated with the coder. The signal identifying section of each binary reading unit constituting the absolute pattern on the coder is the region or area for identifying which of the "0" and "1" signals is assumed by the reading unit. In the magnetic encoder, as shown in FIG. 15, a magnetized region M shown by hatching exists in the reading unit R1 indicating a signal "1", whereas the other reading unit R0 lacks such a magnetized region. These units R0 and R1 are arrayed at a constant pitch on the track 202 as shown in FIG. 15. This partially magnetized region M in one of the units is the signal identifying section that identifies the unit as the "1" signal. With the conventional coder, as shown in FIG. 16, the whole area of the unit R1 indicating the "1" signal is occupied by the magnetized area M, so that the unit as a whole represents the signal identifying section.

Figure 17C:
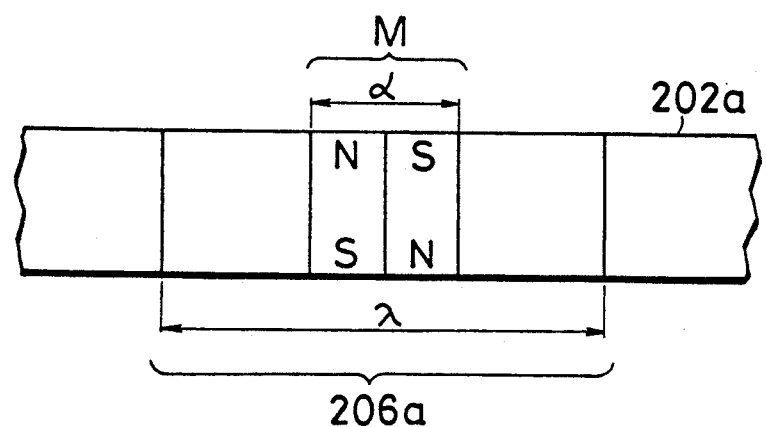
FIG. 17C diagrammatically shows the construction of the magnetized portion M of FIG. 17B.
Figure 17A:
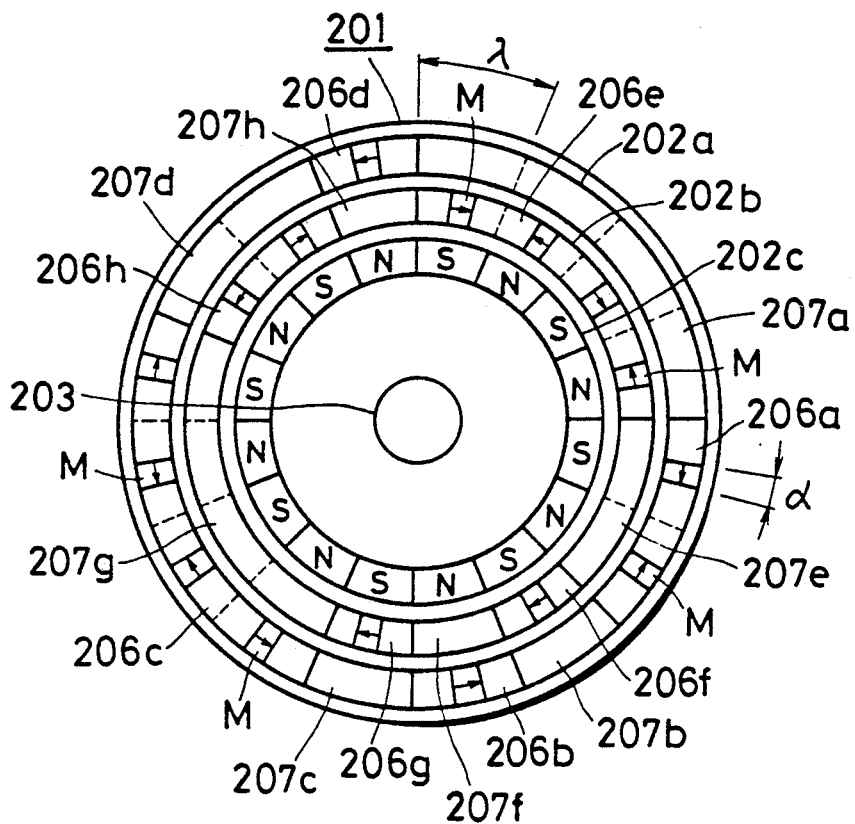
FIG. 17A diagrammatically shows a coder according to the third embodiment for a magnetic absolute encoder.
Figure 17B:
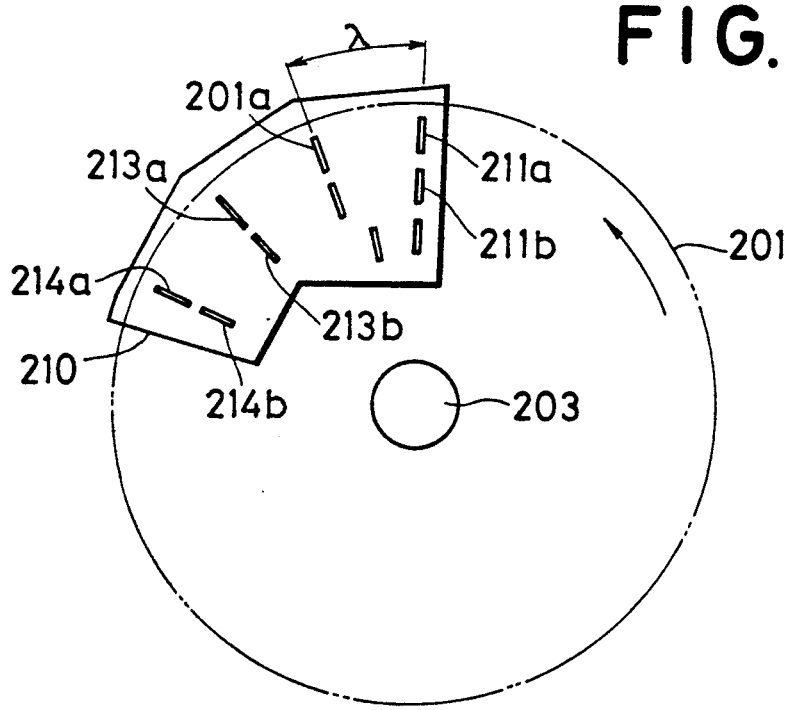
FIG. 17B diagrammatically shows the detector formed by MR elements for reading out the pattern by the magnetized portion of the coder of FIG. 17A.

FIGS. 17A, 17B show the third embodiment of the present invention for the magnetic absolute encoder employing the MR element. FIG. 17A is a schematic plan view of the disk-shaped coder and FIG. 17B is schematic plan view showing the MR element sensor for reading out the absolute pattern signal magnetized on the coder.

Turning to FIG. 17A, three circular tracks 202a, 202b, 202c are arranged concentrically on a coder 201 with the rotation axis 203 as the center. Each of the tracks 202a, 202b is a track having the absolute pattern. In the present embodiment, the S/N ratio in detector reading is improved by using a complementary double track. However, a sole absolute pattern track may be employed.

On the first circular track 202a, a 16-graduation absolute pattern (N=4 bits) obtained by dividing the circumference into 16 equal portions, with each graduation unit corresponding to $\pi/8$ radian, is formed by magnetized graduations 206a to 206d, consisting of graduation units (minimum reading units) having magnetized portions (signal identifying sections) M, with the direction of magnetization as shown by the arrow mark, and non-magnetized graduations 207a to 207d formed by graduation units devoid of the magnetized portions M. FIG. 17C shows the actual status of the magnetized graduation 206a of the magnetized portion M.

On the first circular track 202a, shown in FIG. 17A, the graduations are arranged such that, looking clockwise from the twelve o'clock position, the unmagnetized portion 207a is expressed by four consecutive "0" graduations, the magnetized portion 206a by two consecutive "1" graduations, the unmagnetized portion 207b by a sole "0" graduation, the magnetized portion 206b by a sole "1" graduation, the unmagnetized portion 207c by a sole "0" graduation, the magnetized portion 206c by four consecutive "1" graduations, the unmagnetized portion 207d by two consecutive "0" graduations and the magnetized portion 206d by a sole "0" graduation. Thus the absolute code of the pattern is 0 0 0 0 1 1 0 1 0 1 1 1 1 1 0 0

On the second circular track 202b, an absolute pattern of 16 graduations (N=4 bits), obtained by dividing the circumference into 16 equal portions, with one graduation unit every $\pi/8$ radian, is formed by magnetized portions 206e to 206h and unmagnetized portions 207e to 207h. This absolute pattern is the reverse of the absolute pattern on the first track, such that the absolute code of this pattern is 1 1 1 1 0 0 1 0 1 0 0 0 0 1 1 0

Each of the graduation units constituting the above-mentioned magnetized graduations has a length or angle λ for each graduation and has a central magnetized portion M with a length $a<\lambda$ in the longitudinal direction of the track, where λ is the length of each graduation unit and stands for the arraying pitch of the graduation units, and N=4 in FIG. 17a, so that λ is equivalent to 360/16=22.5 degrees or $\pi/8$ radian of the angular extent on the circular track of the coder 201.

The magnetized portion M is the signal identifying section and has the length $a$ in the longitudinal direction of the track which is lesser than the length λ for one graduation unit. As will be described later, the length α is selected to cover the relative error with the clock signal so that the clock signal as the sync signal always exists in the unit pulse width of the absolute signal corresponding to the length α of the magnetized portion M.

The innermost third track 202c has the incremental pattern for producing the aforementioned clock signals. On this track 202c are arrayed 16 magnetized areas N, S with alternate polarities, corresponding to the graduation length λ, so that the incremental pattern is obtained by dividing the circumference into 16 equal portions.

Turning to FIG. 17B, a detector 210 has a number n=4 of each of MR element sensors 211a to 214a and 211b to 214b for each of the absolute pattern tracks 202a, 202b of the coder 201, and a MR element sensor 230 for reading out the incremental pattern track 202c. This detector 210 is mounted in opposition to the coder 201, as shown by the chain line in FIG. 17B and, with relative rotation between the detector and the coder with the axis of rotation 203 as center of rotation, the sensors 211a to 214a read the absolute pattern by magnetized graduations on the first circular track 202a, while the sensors 211b to 214b read the inverted absolute pattern on the second circular track 202b and the sensor 230 reads the incremental pattern on the third circular track 202c, for producing occasionally synchronized clock signals.

In connection with reading the absolute pattern, it suffices that the arraying interval of the MR element sensors on the same track be equal to λ or an integer multiple thereof, this interval being λ in FIG. 12B. If the interval is an integer multiple of λ, the absolute pattern differs from that described above.

Figure 18:
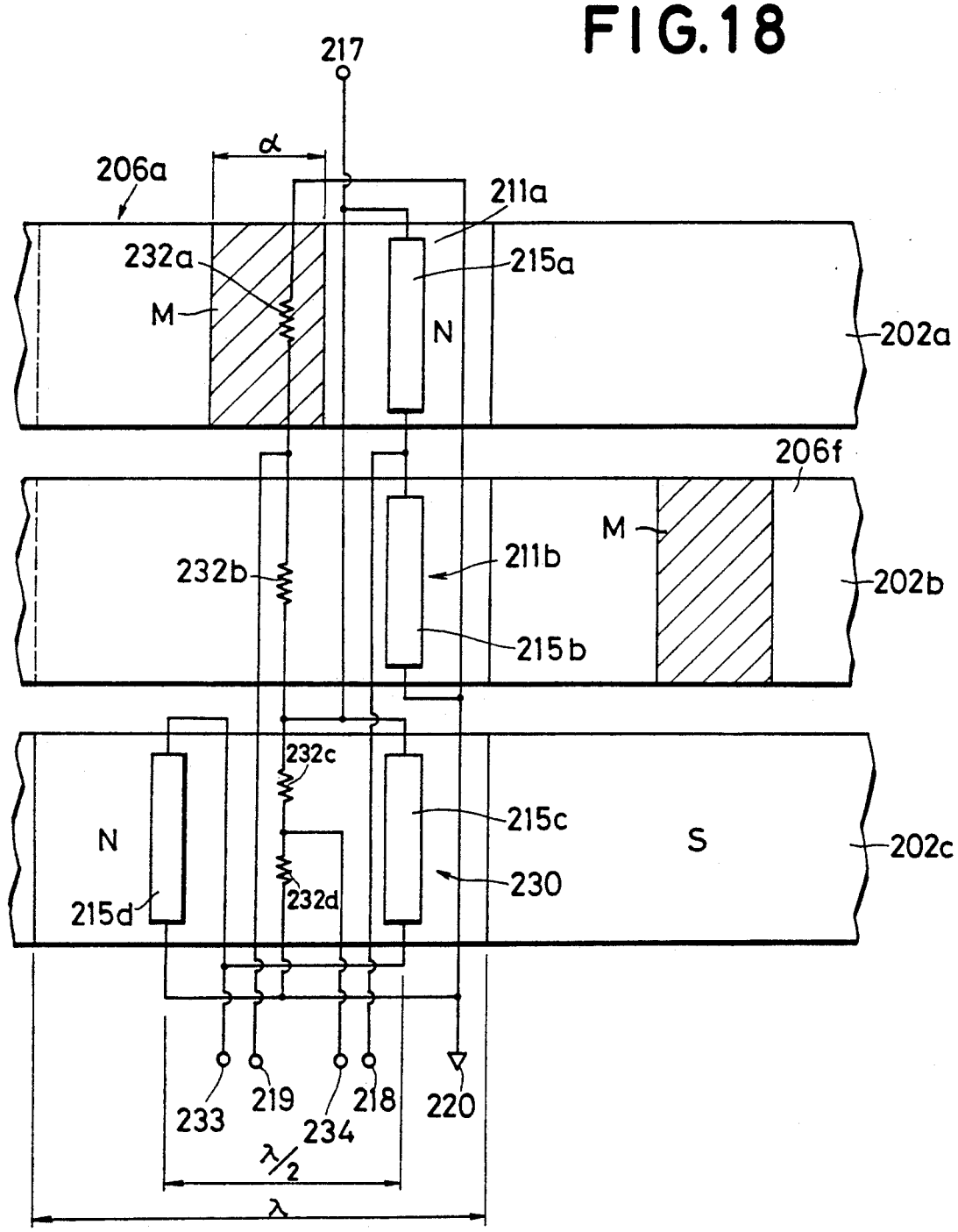
FIG. 18 diagrammatically shows the construction of an individual MR sensor.

In connection with the individual MR element sensors, FIG. 18 shows the construction of the absolute pattern reading sensors 211a, 211b and the correlated construction of the incremental pattern reading sensor 230. The construction of other absolute pattern reading sensors 212a, 212b, 214a, 214b is not described since it is the same as that of the sensors 211a, 211b.

As shown in FIG. 18, the MR element 215a constituting the MR element sensor 211a for the first track 202a and the MR element 215b constituting the MR element sensor 211b for the second track 202b are aligned with each other in a direction normal to the tracks 202a, 202b within a plane parallel to the track plane of the coder. The MR element sensor 230 for the third track 202c consists of two fine MR elements 215c, 215d spaced apart from each other by a distance equal to λ/2 in the longitudinal direction of the track. In this case, the MR elements of the sensors are aligned without position deviation along the track direction. This is because the tracks are arrayed side by side without phase difference along the circumferential direction, as shown in FIG. 17A. When the tracks are arranged with a certain phase gap circumferentially, it is necessary to shift the position of the MR elements 215a, 215b of the sensor 211a, 211b with a corresponding phase difference between each other.

Referring to FIG. 18, the absolute pattern reading MR element 215a is connected in series with a resistor 232a, the absolute pattern reading MR element 215b is connected in series with a resistor 232b, and a bridge circuit is formed between the d.c. source terminals 217 and 220 so that the current direction is reversed between the two series-connected paths. A detection output is produced between signal output terminals 218, 219. Magnetized graduations 206a, 206f for the tracks are also shown for example in FIG. 18.

MR elements 215c, 215d of the sensor 230 for reading the incremental pattern are connected in series between the d.c. power source terminals 217, 220, as shown in FIG. 18 and make up a bridge circuit along with fixed resistors 232c, 232d connected similarly in series between the source terminals, with the mid connection points of the series connection paths being connected to signal output terminals 233, 234. When a horizontal magnetic field is applied to each MR element, its electrical resistance is lowered, depending on the strength and regardless of the polarity of the magnetic field. Hence, by the relative movement between the detection 210 and the coder 201, the signal is produced in the following manner at output terminals 218, 219 of the absolute pattern readout sensors shown in FIG. 18.

When a horizontal magnetic field is applied from the magnetized graduation to the MR element 215a, the resistance of the MR element 215a is diminished to raise the potential at output terminal 218. When the magnetic field is applied to the MR element 215b, the potential at the output terminal 218 is lowered. The potential at the output terminal 219 is fixed at a predetermined level intermediate the d.c. source terminals 217, 220. Since the patterns on the tracks are complementary to each other, and the MR elements of both sensors are not shifted along the track direction, the amplitude waveforms of the voltage across the output terminals 218, 219 are vertically symmetrical, with the phase difference between the two outputs corresponding to a phase difference of 90 degrees for $\pi$ equal to 360 degrees.

On the other hand, signals are generated in the following manner at output terminals 233, 234 of the incremental pattern reading sensor 230. When a horizontal magnetic field is applied to one MR element 215c, its resistance diminishes, so that the potential at the output terminal 233 is raised. When the horizontal magnetic field is applied to the other MR element 215d, its resistance diminishes so that the potential at the output terminal 233 is lowered. On the other hand, the potential at the output terminal 233 is lowered. On the other hand, the potential at the output terminal 234 is fixed at a predetermined intermediate potential between the d.c. source terminals 217, 220 by fixed resistors 232c, 232d.

The distance between the MR elements 215c, 215d is one half the length λ of each magnetized graduation unit of the incremental pattern, or λ/2, so that, when one of the MR elements 215c, 215d exhibits a maximum resistance, the other exhibits a minimum resistance. Thus, with the relative movement between the coder 201 and the detector 210, a signal output changing in dependence upon the horizontal field distribution along the incremental pattern track 202c is produced between output terminals 233, 234.

Figure 19:
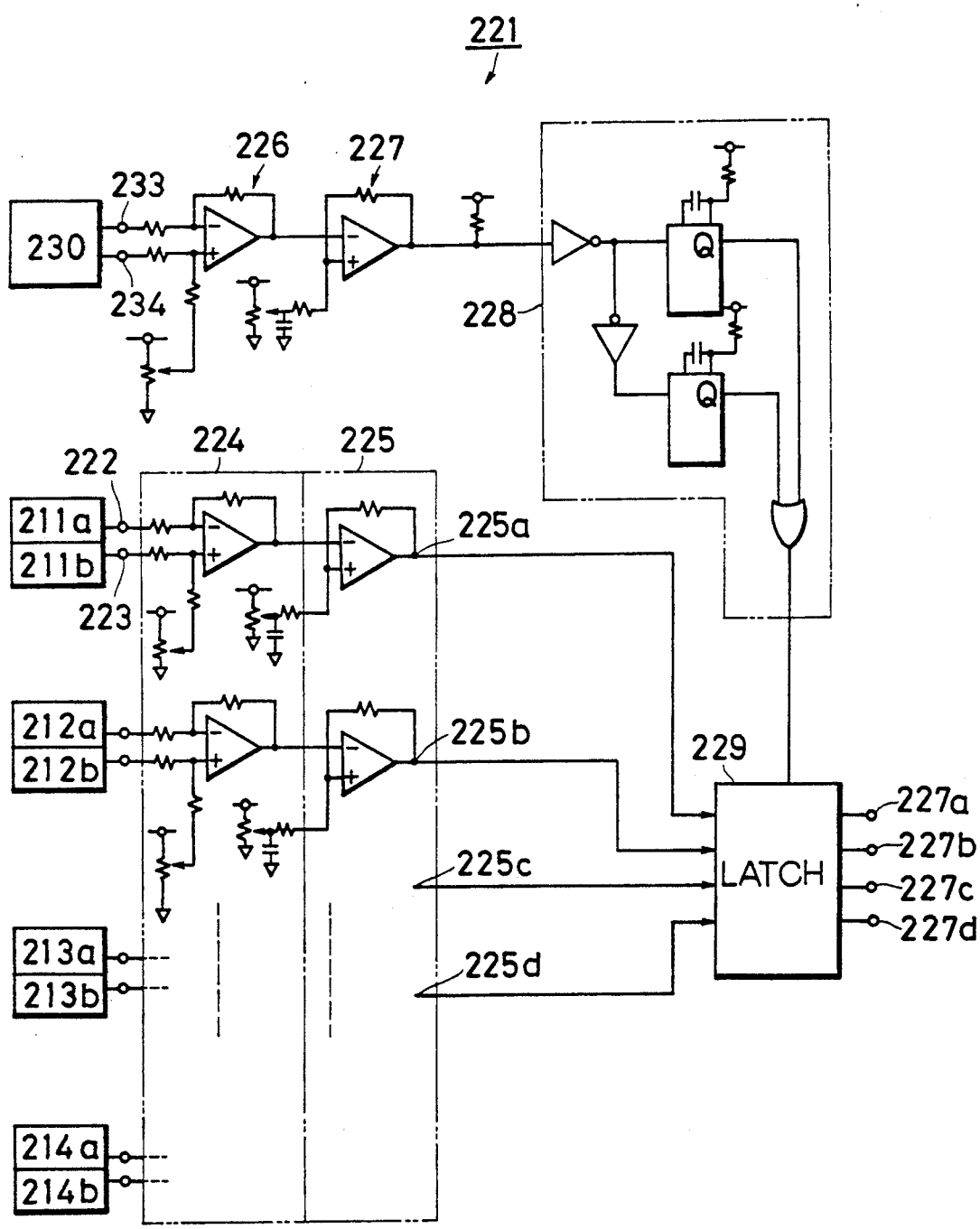
FIG. 19 shows an example of a signal processing circuit for processing output signals of the detector.

FIG. 19 shows an example of a signal processing circuit for processing the detection output of the detector 210, and FIG. 20 shows examples of waveforms of various parts of the signal processing circuit and the horizontal field pattern along the track produced by each magnetized portion of the incremental pattern formed on the track 202c, as well as the complementary pattern formed on the tracks 202a, 202b of the coder 1.

With the detector 210, one output terminal 218 of the absolute pattern reading MR element sensors 211a, 211b is connected to an input terminal 222 of the signal processing circuit 221, while the other output terminal 219 is connected to an input terminal 223. Since the same applies for the other absolute pattern reading MR element sensors 212a, 212b to 214b, only the set of the MR element sensors 211a, 211b is explained.

The magnetic field pattern produced by the magnetized graduations of the absolute pattern formed on track 202a of the coder 201 is shown by waveform a in FIG. 20, while the magnetic field pattern produced by the magnetized graduations of the reverse pattern formed on the complementary track 202b is shown by waveform b in FIG. 20. When these patterns are scanned relatively by the MR element sensors 211a, 211b, pulsed signals shown by waveform d in FIG. 20 are produced at the output terminal 218, while a voltage signal of a substantially constant level as shown by waveform e in FIG. 20 is produced at the other output terminal. When the signals produced at the output terminals 218, 219 are applied and differentially amplified at a differential amplifier 224 of the signal processing circuit 221, a substantially rectangular signal shown by waveform f in FIG. 20 is produced at an output terminal of the differential amplifier 224. The rise and fall edges of this signal are constant and sharp regardless of the pulse width. When the signal is converted into a rectangular wave signal at a predetermined comparison level by a comparator 225, a rectangular signal shown by waveform g in FIG. 20 is produced at an output terminal 225a of the comparator 225, and applied to one of the input terminals of a latch circuit 229. In a similar manner, rectangular wave signals by the detection signals from the sets of sensors 212a-212b, 213a-213b, and 214a-214b are applied to corresponding input terminals of the latch circuit.

The horizontal magnetic field pattern of the incremental pattern formed on the track 202c of the coder 201 is as shown by waveform c in FIG. 20. When this track 202c is scanned by the sensor 230 formed by two MR elements 215c, 215d spaced apart by λ/2 from each other, a pulsed signal having a waveform corresponding to the horizontal magnetic field pattern is produced between the output terminals 233, 234 of the sensor 230. This signal is shaped into a rectangular signal by an amplifier 226 and a Schmitt trigger circuit 227 in the signal processing circuit 221 and applied to a monomultivibrator circuit 228. This circuit 228 is triggered by both the rise and fall of the rectangular wave signal to produce a strobe signal, as the above-mentioned clock signal, as shown at h in FIG. 20, and applies the signal to a latch circuit 229.

Referring to g and h in FIG. 20, the strobe pulse is adapted to be produced in synchronism with the substantially central timing juncture of the pulse width of the minimum graduation unit of the rectangular wave signal, which is the result of readout of the of the absolute pattern, whereby the level readout timing of the rectangular signal from each comparator 225 is made by the latch circuit 229 to coincide with the strobe pulse time point. Thus the rectangular signals may be read simultaneously at the stable time points at about the middle of the pulse width separated from both the rise and fall edges of the rectangular wave as shown at g in FIG. 20 to prevent readout of erroneous contents. The binary numbers of the readout result are shown at i in FIG. 20.

In the present embodiment, selection of the readout timing is realized by suitably selecting the phase difference of the combination of the incremental pattern track 202c and the detector 230 with respect to the combination of the absolute pattern tracks 202a, 202b and the detectors 211a, b to 214a, b.

Each time the strobe pulse as the abovementioned clock signal arrives at the latch circuit 229, the circuit 229 latches the high or low level of the rectangular wave at the input ends, and outputs it at the output terminals 227a to 227d. In this manner, 4-bit binary code signals having different "0, 1" combinations are obtained at the four output terminals 227a to 227d for each partial rotation of π/8 radian of the coder 201.

The rectangular signals appearing at output terminals 225a to 225d of the signal processing circuit 225 by the detection signals from the four sets of sensors are shown in correspondence with FIG. 17A, 17B as shown at a, b, c, d in FIG. 21. Shown at e in FIG. 21 is a rectangular signal corresponding to the read-out results of the incremental pattern output from the Schmitt trigger circuit 227. Strobe pulses affording the readout timing are generated at both the rise and fall edges of this signal. It is assumed that the detector 210 is fixed whereas the coder 201 is rotated counterclockwise as shown by an arrow in FIG. 17B. In the present embodiment, since N=4, the absolute code is such that $2^4 = 16$ graduations. As shown in FIG. 17B, the array of the absolute pattern on the track 202a or the absolute code is determined so that no code signals having the same "0, 1" combination are produced from output terminals 227a to 227d throughout one complete revolution of the coder 201, by detection signals issued by the four sets of MR element sensors 211a-211b, 212a-212b, 213a-213b and 214a-214b, arrayed with a distance λ along the circumference of the coder 201. Such an array may be expressed as 0 0 0 0 1 1 0 1 0 1 1 1 1 0 0 1 as mentioned above.

Therefore, by allotting the output terminals 227a, 227b, 227c and 227d to $2^0$, $2^1$, $2^2$ and $2^3$, respectively, 4-bit absolute signals having different contents for each π/8 radian of the angle of relative rotation are produced. In FIG. 21, hexadecimal numbers corresponding to the respective absolute signals are indicated at f. If may be appreciated that the rectangular signals shown in FIG. 21, when expressed directly as the figures, prove to be 16 hexadecimal numbers, and that there is no same content at the same place when the coder 201 is rotated, so that an absolute encoder construction is realized.

Figure 22A:
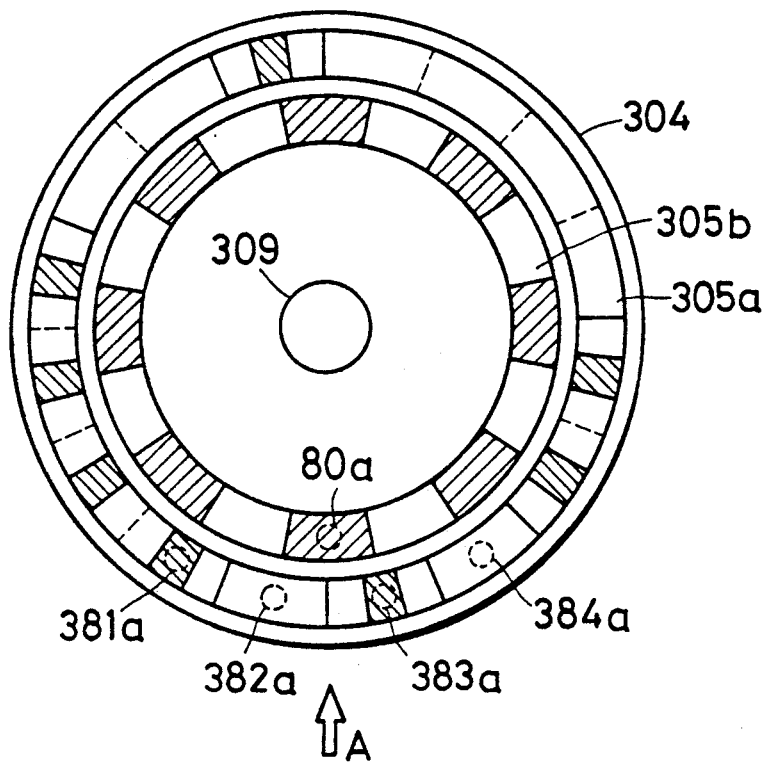
FIG. 22A diagrammatically shows the coder for the optical absolute encoder according to modification of the third embodiment.
Figure 23:
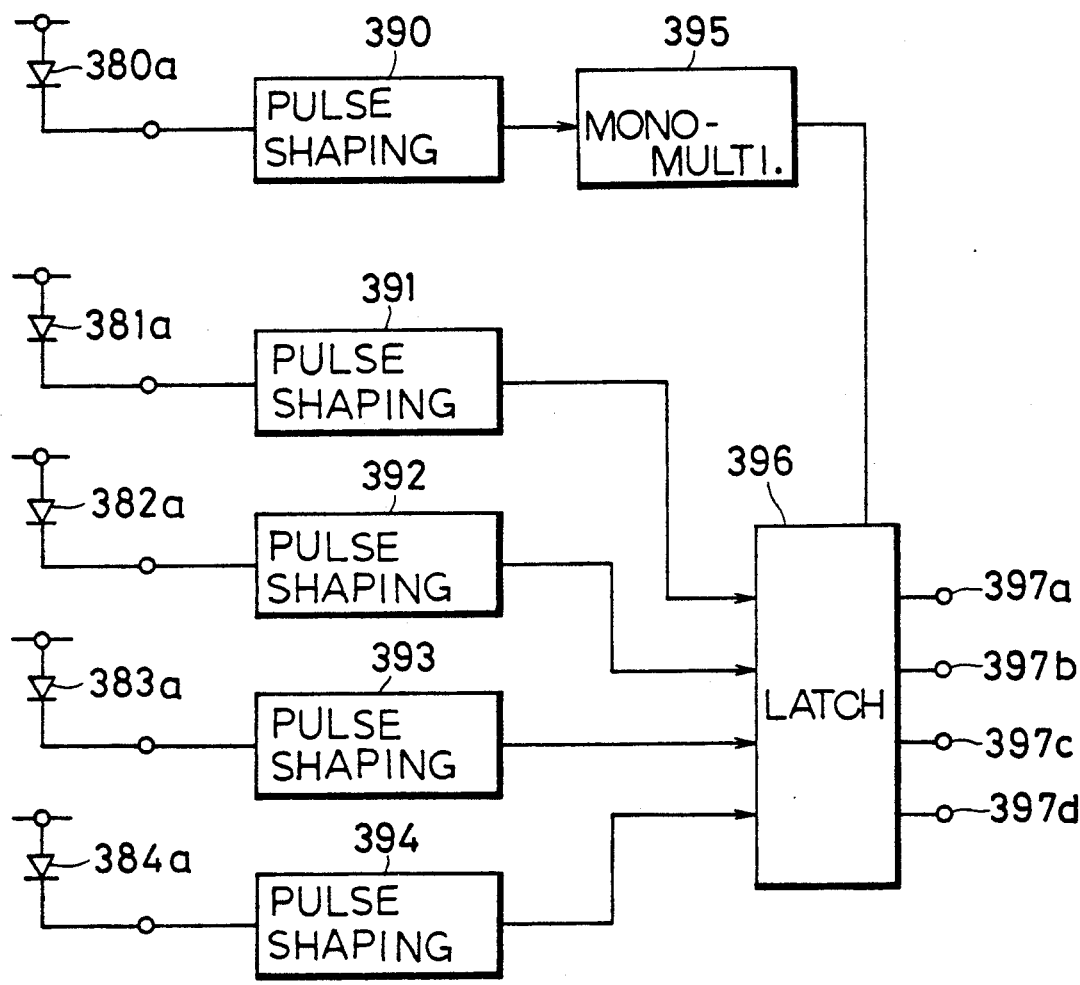
FIG. 23 shows an example of a signal processing circuit for processing an output signal of a photoelectric sensor of FIG. 22B.

While the above is concerned with an example of the magnetic type absolute encoder, FIGS. 22A, B and FIG. 23 show an embodiment of an optical absolute encoder.

In FIG. 22A, the coder 304 is provided with a track 305A having an absolute pattern which is the same as that described above and which consists of "0" graduation units formed only by opaque portions and "1" graduation units including transparent portions T, and a track 305b having an incremental pattern formed by alternate repetitions of the opaque and transparent portions in 16 circumferential divisions. As in the above-described magnetic system, the transparent portion T in the track 305a of the absolute pattern represents a signal identification section, with the distance α in the track direction being shorter than the length λ of the graduation unit.

Figure 22B:
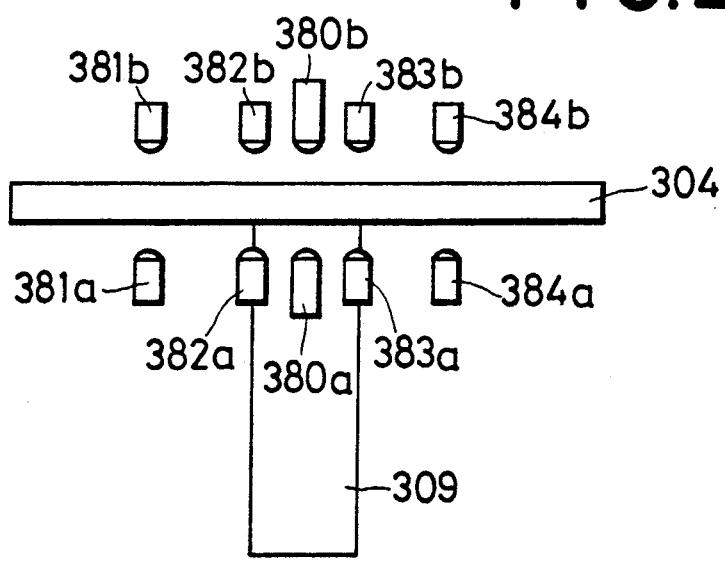
FIG. 22B diagrammatically shows the combination of the coder with each sensor as viewed from the direction of the arrow in FIG. 22A.

On both sides of the coder 304, as shown in FIG. 22B, sets of light sources 381a to 384a, sets of photo-electric sensors 381b to 384b and a set of a light source 380a and a photo-electric sensor 380b are arranged, these sensors and the coder 304 performing relative rotation about the axis of rotation 309.

These sensors are comprised of four photoelectric sensors 381a, 382a, 383a, 384a, arrayed in the longitudinal direction of the track with a relative interval λ to read out the track 304a, and a sole photo-electric sensor 380b to read out the track 305b. As in the above-described embodiment of the magnetic absolute encoder, the photo-electric sensors 381b to 384b are arrayed along the track 305a with a relative distance λ, and the photo-electric sensor 380b is arranged on the track 305b at an angular position shifted λ/2 relative thereto.

In FIG. 23 shows an example of a signal processing circuit for processing detection outputs of the sensors 380b to 384b. In the signal processing circuit of FIG. 23, these detection outputs of the photo-electric sensors are shaped by pulse shaping circuits 390 to 394 to produce rectangular signals shown in FIG. 21, as in the magnetic encoder. In FIG. 21, a to d correspond to the output waveforms of the shaping circuits 391 to 394, while e corresponds to the output waveform of the shaping circuit 390. As shown in FIG. 21, the rise and fall timings of the rectangular wave signal (e) obtained from the detection signal of the photo-electric sensor 380b, corresponding to the readout results of the incremental pattern, are substantially at the center of the pulse width of the minimum graduation units of the rectangular wave signals a to d. The rectangular wave signal e is applied as the trigger signal to a monomultivibrator 395 which produces pulse outputs at both the rise and fall of the trigger pulse. Numeral 396 denotes a latch circuit which latches the rectangular wave signals a to d output from the pulse shaping circuits 391 to 394 at the arrival timing of pulse (strobe pulse) signals output from the monomultivibrator circuit 395, and these signals appear at output terminals 397a to 397d. It is to be noted that the 4-bit binary code signals similar to those described above may be produced at the output terminals 397a to 397d.

Although the notary encoder for reading out the rotational angular positions has been explained in the above third embodiment, the present embodiment may also be applied to a linear encoder for reading out the linear position, in which case the above-described absolute pattern may be formed linearly on the coder which is in the form of a strip plate.

It is to be noted that the above-described second and third embodiments and their modifications may be practiced in combination with the system of the first embodiment.

What is claimed is:

1. An absolute position detection encoder comprising:
   coder means provided with track means in which an absolute pattern having code contents of a plurality of bits is realized by series type first graduations;
   detector means relatively movable with respect to said coder means and adapted to read out said first graduations to produce a plurality of detection pulse trains having a phase difference corresponding to a length which is an integer multiple of a minimum reading unit of said first graduations; and
   signal processing means for processing said detection pulse trains obtained upon reading said first graduations by said detector means with clock signals synchronized at time points corresponding substantially to an intermediate position of the minimum reading unit of said first graduations to produce parallel output signals of signal code contents corresponding to the absolute position of said detector means relative to said coder means.

2. The absolute position encoder according to claim 1, wherein said firsts graduations on said track means are composed in an absolute pattern having the binary code contents of a number n of bits, n being an integer, and constituted by a number X of graduation elements, X being an integer satisfying the relation $2^{n-1} < X \leq 2^n$, and wherein said detector means produce a number n of sets of said detection pulses.

3. The absolute position detection encoder according to claim 1, wherein said track means on said coder means comprises second graduations constituting an incremental pattern formed by binary repetitive graduation elements of a constant pitch parallel to said first graduations, and wherein said detector means is responsive to said relative movement by reading out said second gradations to produce a periodic rectangular wave signal synchronized with a unit pulse corresponding to said minimum reading unit in said detection pulse train, said signal processing means performing said signal processing in synchronism with said rectangular wave signal.

4. The absolute position detection encoder according to claim 3, wherein said detector means comprises a plurality of sets of absolute signal detectors for reading out said absolute pattern to produce for each of said sets a first signal of a corresponding pulse train and a second signal having a phase difference equal to one half the unit pulse width corresponding to said minimum reading unit in said pulse train, and an incremental signal detector for reading out said incremental signal to produce a binary signal having a repetitive period substantially equal to said minimum pulse width at a phase difference of about one-fourth said repetitive period relative to the unit pulse corresponding to said minimum reading unit in said pulse train, and wherein
   said signal processing means comprises a signal selection means taking out only said first signal from each set of the absolute signal detectors when said binary signal assumes one value and taking out only said second signal when said binary signal assumes another value.

5. The absolute position detector encoder according to claim 4, wherein said first graduations on said track means are composed in an absolute pattern having the binary code contents of a number n of bits, n being an integer, and constituted by a number X of graduation elements, X being an integer satisfying the reaction $2^{n-1} < X \leq 2^n$, and wherein said detector means comprise a number n of sets of said absolute signal detectors for producing for each set a number n of sets of first signals and a number n of sets of said second signals.

6. The absolute position detection encoder according to claim 3, wherein said encoder further comprises sub-scale signal generating means for producing, on the basis of the read-out results of said incremental pattern, a sub-scale pulse signal having a period corresponding to an integer fraction of the period of the unit pulse in said pulse train corresponding to the minimum reading unit in said absolute pattern.

7. The absolute position detection encoder according to claim 6 wherein said signal processing means produces said absolute position parallel output signal to which said sub-scale pulse signal is added to the least or most significant bit.

8. The absolute position detection encoder according to according to claim 6, wherein said detector means produces, on the basis of the incremental pattern readout results, a phase A rectangular signal and a phase B rectangular signal out of phase by 90 degrees relative to each other and each having a duty cycle of 50%, and wherein said sub-scale signal generating means generates said sub-scale pulse signal on the basis of the phase A and phase B rectangular signals.

9. The absolute position detection encoder according to claim 6 wherein said signal processing means performs said signal processing using both the rise and the fall of said phase A or phase B rectangular signal.

10. The absolute position detection encoder according to claim 6, wherein said sub-scale signal generating means comprises circuit means for generating pulse signals corresponding to the exclusive OR of said phase A and phase B rectangular signals.

11. The absolute position detection encoder according to claim 6, wherein said detector means produces, on the basis of the incremental pattern readout results, a phase A rectangular signal and a phase B rectangular signal out of phase by 90 degrees relative to each other and each having a duty cycle of 50%, and wherein the unit graduation element of the incremental pattern along the track direction is one-half the minimum reading unit of the absolute pattern.

12. The absolute position detection encoder according to claim 1, wherein a signal identifying section as an area identifying the binary signal of at least one of two minimum reading units constituting said first graduations is restrictively formed in an area of said readout unit which is shorter than the overall length along the track direction of said reading unit.

13. The absolute position detection encoder according to claim 12, wherein said signal identifying section occupies a position at approximately the midpoint of the minimum reading unit of said first graduations.

* * * * *